United States Patent
Basler et al.

(10) Patent No.: US 11,742,391 B2
(45) Date of Patent: Aug. 29, 2023

(54) SEMICONDUCTOR COMPONENT HAVING A DIODE STRUCTURE IN A SIC SEMICONDUCTOR BODY

(71) Applicant: Infineon Technologies AG, Neubiberg (DE)

(72) Inventors: Thomas Basler, Chemnitz (DE); Hans-Joachim Schulze, Taufkirchen (DE); Ralf Siemieniec, Villach (AT)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 17/163,955

(22) Filed: Feb. 1, 2021

(65) Prior Publication Data

US 2021/0159316 A1     May 27, 2021

Related U.S. Application Data

(62) Division of application No. 16/281,257, filed on Feb. 21, 2019, now Pat. No. 10,950,696.

(30) Foreign Application Priority Data

Feb. 22, 2018 (DE) .......................... 102018103973.5

(51) Int. Cl.
*H01L 29/06* (2006.01)
*H01L 29/861* (2006.01)
(Continued)

(52) U.S. Cl.
CPC ...... *H01L 29/1608* (2013.01); *H01L 29/0603* (2013.01); *H01L 29/0619* (2013.01);
(Continued)

(58) Field of Classification Search
CPC ................. H01L 29/1608; H01L 29/32; H01L 29/861–885
See application file for complete search history.

(56) References Cited

U.S. PATENT DOCUMENTS 4,823,172 A    4/1989 Mihara
6,008,520 A    12/1999 Darwish et al.
(Continued)

FOREIGN PATENT DOCUMENTS

DE    102004029297 A1    11/2005
DE    102005041358 A1    3/2007
(Continued)

OTHER PUBLICATIONS

Hsu, Fu-Jen, et al., "High Efficiency High Reliability SiC MOSFET with Monolithically Integrated Schottky Rectifier", Proceedings of The 29th International Symposium on Power Semiconductor Devices & ICs, Sapporo, Japan, May 28-Jun. 1, 2017, pp. 45-48.
(Continued)

*Primary Examiner* — Daniel P Shook
(74) *Attorney, Agent, or Firm* — Murphy, Bilak & Homiller, PLLC

(57) ABSTRACT

A semiconductor component includes a semiconductor component, including: a merged PiN Schottky (MPS) diode structure in a SiC semiconductor body having a drift zone of a first conductivity type; an injection region of a second conductivity type adjoining a first surface of the SiC semiconductor body; a contact structure at the first surface, the contact structure forming a Schottky contact with the drift zone and electrically contacting the injection region; and a zone of the first conductivity type formed between the injection region and a second surface of the SiC semiconductor body, the second surface being situated opposite the first surface. The zone is at a maximal distance of 1 μm from the injection region of the second conductivity type.

9 Claims, 15 Drawing Sheets

(51) Int. Cl.

| | | |
|---|---|---|
| *H01L 29/78* | (2006.01) | |
| *H01L 29/872* | (2006.01) | |
| *H01L 29/16* | (2006.01) | |
| *H01L 29/66* | (2006.01) | |
| *H01L 29/167* | (2006.01) | |
| *H01L 29/32* | (2006.01) | |
| *H01L 29/08* | (2006.01) | |
| *H01L 29/417* | (2006.01) | |

(52) U.S. Cl.
CPC ...... *H01L 29/0696* (2013.01); *H01L 29/0878* (2013.01); *H01L 29/167* (2013.01); *H01L 29/32* (2013.01); *H01L 29/66068* (2013.01); *H01L 29/7805* (2013.01); *H01L 29/7811* (2013.01); *H01L 29/7813* (2013.01); *H01L 29/861* (2013.01); *H01L 29/872* (2013.01); *H01L 29/41766* (2013.01)

(56) References Cited

U.S. PATENT DOCUMENTS

| | | |
|---|---|---|
| 7,582,922 B2 | 9/2009 | Werner |
| 7,700,971 B2 | 4/2010 | Ueno |
| 7,872,308 B2 | 1/2011 | Akiyama et al. |
| 7,989,882 B2 | 8/2011 | Zhang et al. |
| 8,252,645 B2 | 8/2012 | Hshieh |
| 8,431,470 B2 | 4/2013 | Lui et al. |
| 8,525,254 B2 | 9/2013 | Treu et al. |
| 8,637,922 B1 | 1/2014 | Siemieniec et al. |
| 8,653,589 B2 | 2/2014 | Hsieh |
| 9,093,522 B1 | 7/2015 | Zeng et al. |
| 9,136,372 B2 | 9/2015 | Miyahara et al. |
| 9,293,558 B2 | 3/2016 | Siemieniec et al. |
| 9,478,655 B2 | 10/2016 | Siemieniec et al. |
| 9,496,384 B2 | 11/2016 | Nakano |
| 9,577,073 B2 | 2/2017 | Esteve et al. |
| 9,837,527 B2 | 12/2017 | Siemieniec et al. |
| 9,929,265 B1 | 3/2018 | Kondo et al. |
| 10,211,306 B2 | 2/2019 | Siemieniec et al. |
| 10,304,953 B2 | 5/2019 | Aichinger et al. |
| 10,586,845 B1 | 3/2020 | Aichinger et al. |
| 10,700,192 B2 | 6/2020 | Siemieniec et al. |
| 10,714,609 B2 | 7/2020 | Aichinger et al. |
| 2003/0020134 A1 | 1/2003 | Werner et al. |
| 2006/0076617 A1 | 4/2006 | Shenoy et al. |
| 2006/0246650 A1 | 11/2006 | Williams et al. |
| 2006/0267085 A1 | 11/2006 | Matsuura |
| 2008/0121989 A1 | 5/2008 | Kocon et al. |
| 2008/0315250 A1 | 12/2008 | Onozawa |
| 2009/0146209 A1 | 6/2009 | Akiyama et al. |
| 2010/0308401 A1 | 12/2010 | Narazaki |
| 2011/0284954 A1 | 11/2011 | Hsieh |
| 2012/0248530 A1 | 10/2012 | Lui et al. |
| 2012/0319132 A1 | 12/2012 | Bhalla et al. |
| 2013/0168701 A1 | 7/2013 | Kiyosawa et al. |
| 2013/0200451 A1 | 8/2013 | Yilmaz et al. |
| 2013/0313635 A1 | 11/2013 | Nakano |
| 2013/0341711 A1 | 12/2013 | Matsumoto et al. |
| 2014/0021484 A1 | 1/2014 | Siemieniec et al. |
| 2014/0145206 A1 | 5/2014 | Siemieniec et al. |
| 2014/0145258 A1 | 5/2014 | Lin |
| 2014/0159053 A1 | 6/2014 | Chen et al. |
| 2014/0167151 A1 | 6/2014 | Yen et al. |
| 2014/0210000 A1 | 7/2014 | Tokuda et al. |
| 2014/0210001 A1 | 7/2014 | Yamazaki |
| 2016/0163852 A1 | 6/2016 | Siemieniec et al. |
| 2016/0260829 A1 | 9/2016 | Aichinger et al. |
| 2017/0236931 A1 | 8/2017 | Meiser et al. |
| 2017/0345905 A1 | 11/2017 | Siemieniec et al. |
| 2018/0122933 A1 | 5/2018 | Matocha et al. |
| 2018/0277637 A1 | 9/2018 | Meiser et al. |
| 2018/0358449 A1 | 12/2018 | Zeng et al. |
| 2019/0067462 A1* | 2/2019 | Tamura ............... H01L 27/0727 |
| 2019/0081170 A1 | 3/2019 | Kumagai |
| 2019/0109227 A1 | 4/2019 | Kobayashi et al. |
| 2019/0245075 A1 | 8/2019 | Aichinger et al. |
| 2019/0259842 A1 | 8/2019 | Basler et al. |
| 2019/0326388 A1 | 10/2019 | Arai et al. |
| 2019/0341447 A1 | 11/2019 | Siemieniec et al. |
| 2020/0161433 A1 | 5/2020 | Leendertz et al. |
| 2020/0161437 A1 | 5/2020 | Meiser et al. |

FOREIGN PATENT DOCUMENTS

| | | |
|---|---|---|
| DE | 102012211221 A1 | 1/2013 |
| DE | 102013214196 A1 | 1/2014 |
| DE | 102014113130 A1 | 3/2015 |
| DE | 102014117780 A1 | 6/2016 |
| DE | 102017108738 A1 | 10/2018 |
| DE | 102017128633 A1 | 6/2019 |
| DE | 102018103973 A1 | 8/2019 |
| DE | 102018124737 A1 | 4/2020 |
| DE | 102018124740 A1 | 4/2020 |
| JP | H06104484 A | 4/1994 |
| JP | 07240409 A | 9/1995 |
| JP | 09260650 A | 10/1997 |
| JP | H11154748 A | 6/1999 |
| JP | 2000031484 A | 1/2000 |
| JP | 2000277734 A | 10/2000 |
| JP | 2007080971 A | 3/2007 |
| JP | 2007129259 A | 5/2007 |
| JP | 2007221012 A | 8/2007 |
| JP | 2008505480 A | 2/2008 |
| JP | 2008108824 A | 5/2008 |
| JP | 2008159916 A | 7/2008 |
| JP | 2009117593 A | 5/2009 |
| JP | 2009117649 A | 5/2009 |
| JP | 2009187966 A | 8/2009 |
| JP | 2010541288 A | 12/2010 |
| JP | 2011049267 A | 3/2011 |
| JP | 2012044167 A | 3/2012 |
| JP | 2012151470 A | 8/2012 |
| JP | 2013214661 A | 10/2013 |
| JP | 2014003191 A | 1/2014 |
| JP | 2014075582 A | 4/2014 |
| JP | 2014107571 A | 6/2014 |
| JP | 2014165348 A | 9/2014 |
| JP | 2015226060 A | 12/2015 |
| WO | 03010812 A1 | 2/2003 |
| WO | 03019623 A2 | 3/2003 |
| WO | 2011151901 A1 | 12/2011 |

OTHER PUBLICATIONS

Jiang, Huaping, et al., "SiC MOSFET with Built-in SBD for Reduction of Reverse Recovery Charge and Switching Loss in 10-kV Applications", Proceedings of The 29th International Symposium on Power Semiconductor Devices & ICs, Sapporo, Japan, May 28-Jun. 1, 2017, pp. 49-52.

Kawahara, Koutarou, et al., "6.5 kV Schottky-Barrier-Diode-Embedded SiC-MOSFET for Compact Full-Unipolar Module", Proceedings of The 29th International Symposium on Power Semiconductor Devices & ICs, Sapporo, Japan, May 28-Jun. 1, 2017, pp. 41-44.

Unknown, Author, "CMF20120D-Silicon Carbide Power MOSFET 1200V 80 mΩ: Z-Fet MOSFET N-Channel Enhancement Mode", CMF20120D Rev. A, Cree, Inc., 2012, 1-13.

* cited by examiner

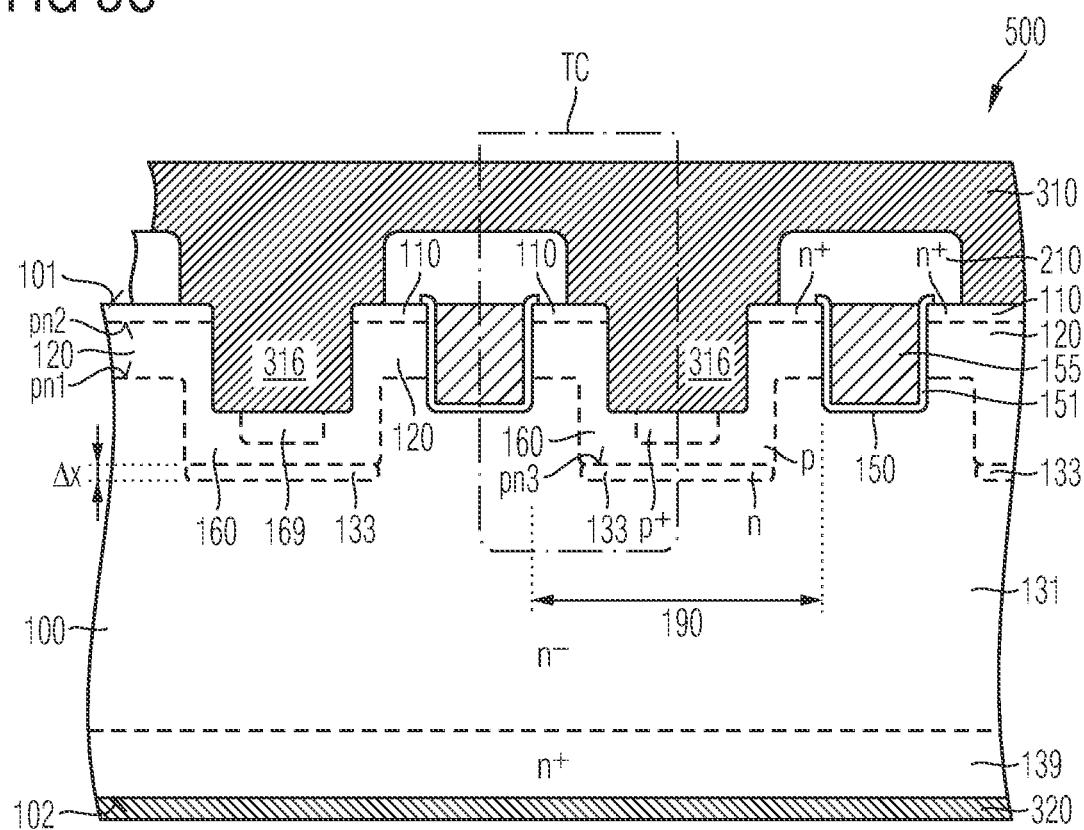

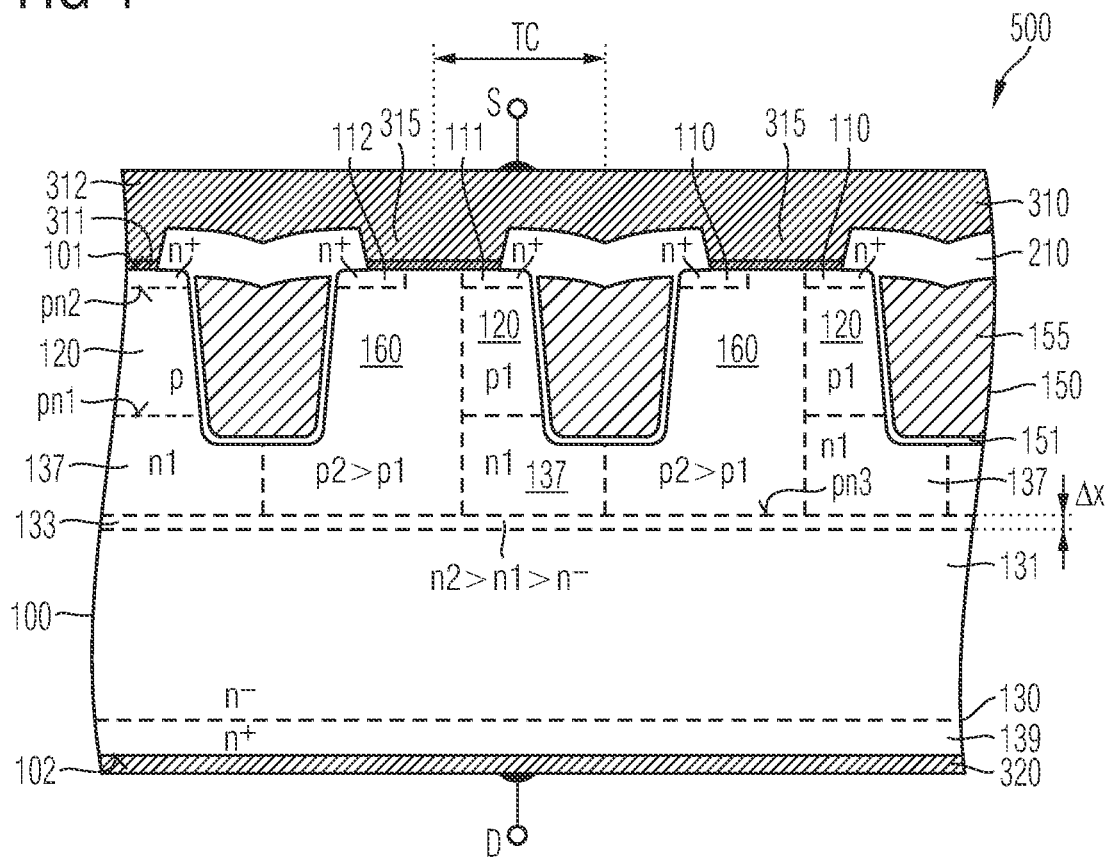

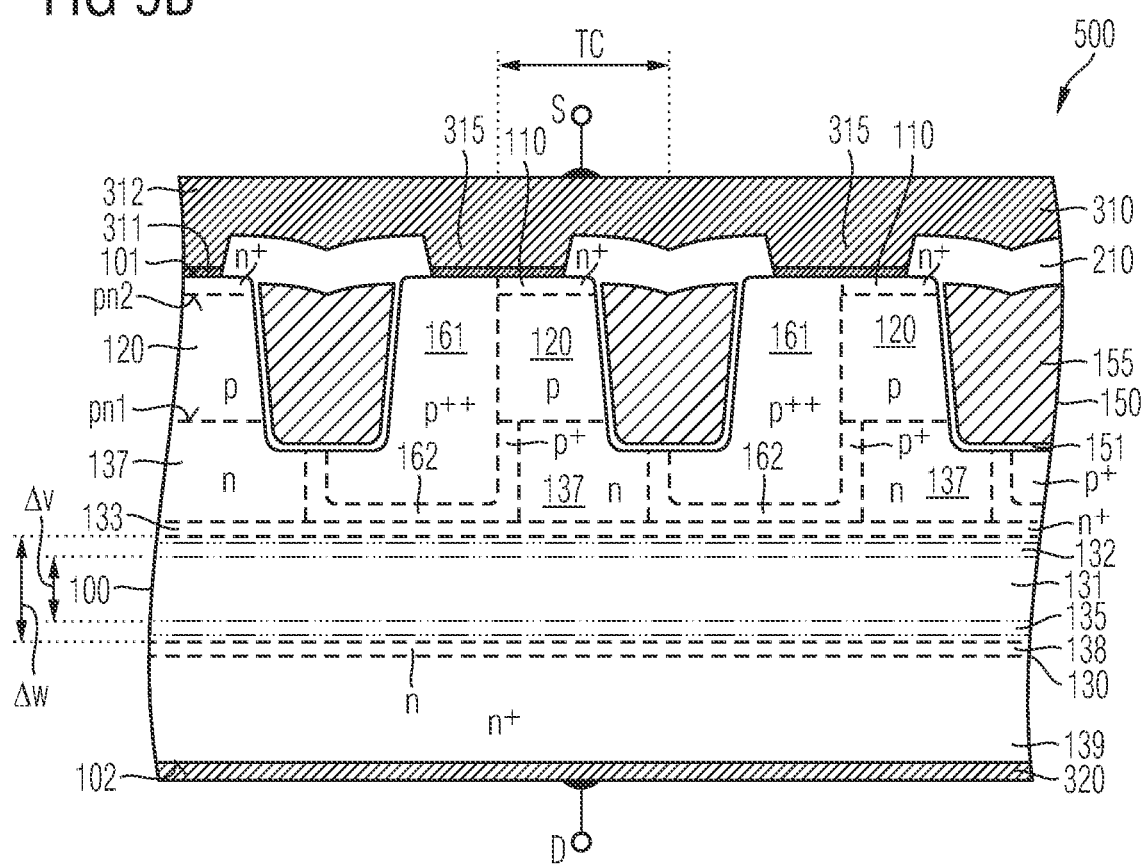

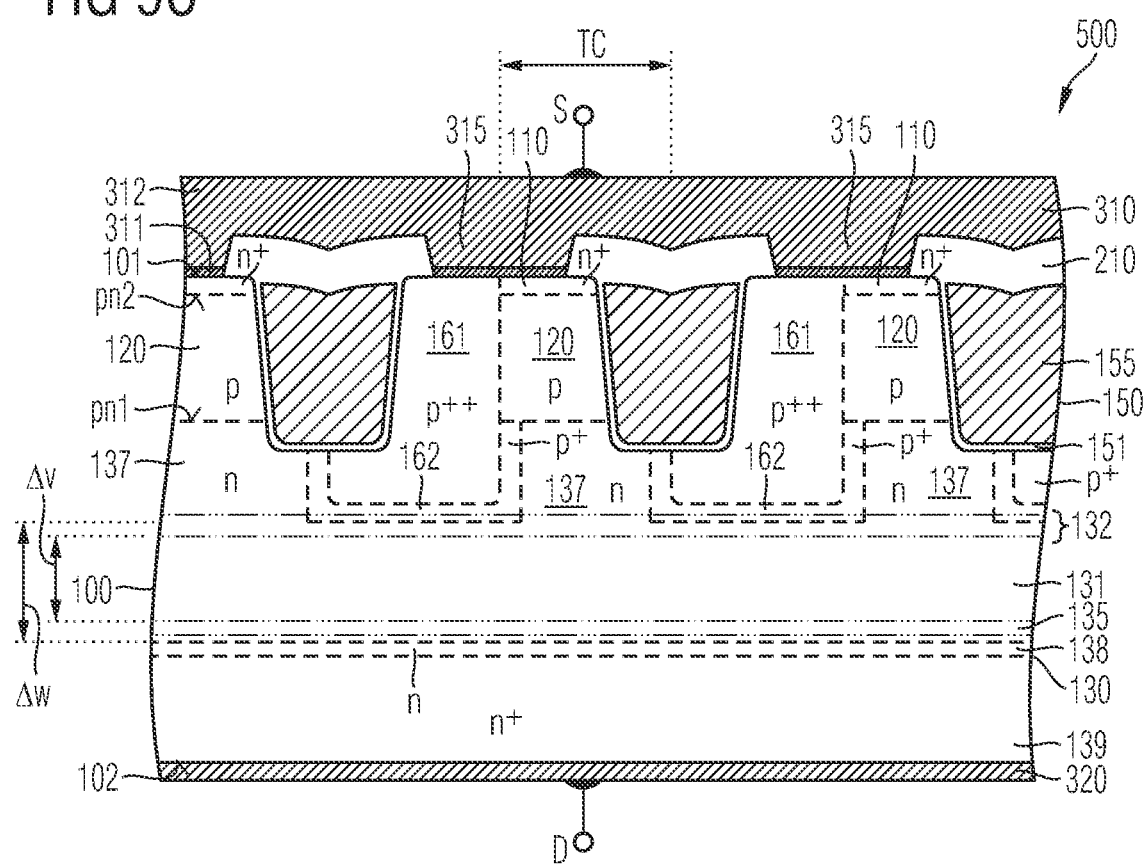

SEMICONDUCTOR COMPONENT HAVING A DIODE STRUCTURE IN A SIC SEMICONDUCTOR BODY

TECHNICAL FIELD

The present application relates to SiC (silicon carbide) semiconductor components, for example semiconductor switches having a low on resistance and a high dielectric strength.

BACKGROUND

In semiconductor components having field effect transistor structures and a drift zone, pn junctions between the drift zone and body regions of the field effect transistors form an intrinsic body diode. If the body diode is operated in the forward direction, then a bipolar charge carrier flow through the body regions and the drift zone is established. Electrical properties of the body diode, such as e.g. threshold voltage, forward voltage and current-carrying capacity, result from the doping and the dimensions of doped regions at semiconductor/metal junctions, which are in turn defined with regard to the transistor properties sought.

It is generally endeavoured to improve properties such as the avalanche robustness, the breakdown strength and the on resistance of components.

SUMMARY

The present disclosure relates to a semiconductor component comprising a field effect transistor structure in a SiC semiconductor body having a gate structure at a first surface of the SiC semiconductor body and a drift zone of a first conductivity type. A zone of the first conductivity type is formed in a vertical direction between a semiconductor region of a second conductivity type and the drift zone. The zone is spaced apart from the gate structure and is at a maximal distance of 1 μm from the semiconductor region in the vertical direction.

The present disclosure additionally relates to a semiconductor component comprising a Merged Pin Schottky, MPS, diode structure in a SiC semiconductor body having a drift zone of a first conductivity type. An injection region of a second conductivity type adjoins a first surface of the SiC semiconductor body. A contact structure at the first surface forms a Schottky contact with the drift zone and electrically contacts the injection region. A zone of the first conductivity type is formed between the injection region and a second surface of the SiC semiconductor body, said second surface being situated opposite the first surface. The zone is at a maximal distance of 1 μm from the injection region of the second conductivity type.

The present disclosure furthermore relates to a semiconductor component comprising a pn diode structure in a SiC semiconductor body having a drift zone of a first conductivity type. An injection region of a second conductivity type adjoins a first surface of the SiC semiconductor body. A contact structure at the first surface electrically contacts the injection region. A zone of the first conductivity type is formed between the injection region and a second surface of the SiC semiconductor body, said second surface being situated opposite the first surface. The zone is electrically isolated from the contact structure at the first surface and is at a maximal distance of 1 μm from the injection region of the second conductivity type.

The present disclosure additionally relates to a semiconductor component comprising a SiC semiconductor body having a drift zone of a first conductivity type. A doped region of a second conductivity type is formed between a first surface of the SiC semiconductor body and the drift zone. A recombination zone having recombination centres composed of lattice defects and/or heavy metal atoms is formed between the doped region and a second surface situated opposite the first surface. A further recombination zone having recombination centres composed of lattice defects and/or heavy metal atoms, said further recombination zone being spaced apart from the recombination zone, is formed between the doped region and the recombination zone or in the doped region and is formed at a maximum distance of 1 μm from the drift zone.

Further features and advantages of the disclosed subject matter will become apparent to the person skilled in the art upon reading the following detailed description and upon consideration of the drawings.

BRIEF DESCRIPTION OF THE DRAWINGS

The accompanying drawings convey a deeper understanding of exemplary embodiments of a semiconductor component and of a method for producing a semiconductor component, are included in the disclosure and form a part thereof. The drawings merely illustrate embodiments and together with the invention serve to elucidate the principles thereof. The semiconductor component described herein, and the method described herein are therefore not restricted to the exemplary embodiments by the description thereof. Further exemplary embodiments and intended advantages emerge from the understanding of the following detailed description and also from combinations of the exemplary embodiments described below, even if they are not explicitly described. The elements and structures shown in the drawings are not necessarily illustrated as true to scale with respect to one another. Identical reference signs refer to identical or mutually corresponding elements and structures.

FIG. 3C is a schematic vertical cross section through a section of a SiC semiconductor component in accordance with one embodiment comprising deep gate structures, deep contact trenches and comprising zones aligned with diode terminal regions for reducing the emitter efficiency of an intrinsic body diode.

FIG. 4 is a schematic vertical cross section through a section of a SiC semiconductor component in accordance with one embodiment comprising deep gate structures and comprising a continuous zone of the conductivity type of the drift zone for reducing the emitter efficiency of an intrinsic body diode.

FIG. 9B is a schematic vertical cross section through a section of a SiC semiconductor component comprising a zone for reducing the emitter efficiency of an intrinsic body diode in accordance with one embodiment comprising recombination zones near the rear side of the component and the front side of the component.

FIG. 9C is a schematic vertical cross section through a section of a SiC semiconductor component in accordance with one embodiment comprising recombination zones near the rear side of the component and the front side of the component.

DETAILED DESCRIPTION

Figure 1:
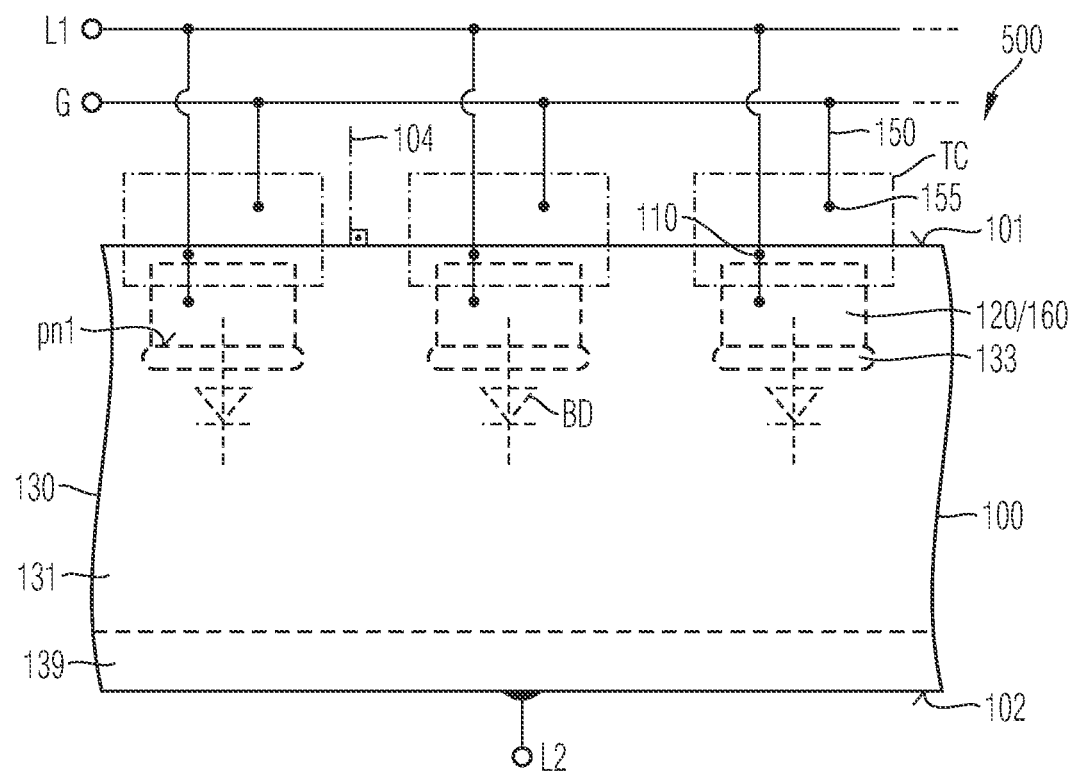
FIG. 1 is a schematic vertical cross section through a section of a SiC semiconductor component comprising an intrinsic body diode having a reduced emitter efficiency in accordance with one embodiment comprising a zone of the conductivity type of the drift zone between the body regions and the drift zone.

In the following detailed description, reference is made to the accompanying drawings, which form part of the disclosure and show specific exemplary embodiments of a semiconductor component and of a method for producing a semiconductor component for illustration purposes. It goes without saying that further exemplary embodiments exist. It likewise goes without saying that structural and/or logical changes can be made to the exemplary embodiments, without in so doing departing from what is defined by the patent claims. The description of the exemplary embodiments is non-limiting in this respect. In particular, features of exemplary embodiments described below can be combined with features of others of the exemplary embodiments described, provided that nothing to the contrary is evident from the context.

The terms "have", "contain", "encompass", "comprise" and similar terms are open terms and indicate the presence of the stated structures, elements or features, but do not exclude the presence of additional elements or features. The indefinite articles and the definite articles are intended to encompass both the plural and the singular, unless something to the contrary is clearly evident from the context.

The term "electrically connected" describes a permanent low-impedance connection between electrically connected elements, for example a direct contact between the relevant elements or a low-impedance connection via a metal and/or a highly doped semiconductor. The term "electrically coupled" encompasses the fact that one or more intervening elements suitable for signal transmission can be present between the electrically coupled elements, for example elements which provide at times, in a first state, a low-impedance connection and, in a second state, a high-impedance electrical decoupling.

The figures illustrate relative doping concentrations by the signs of "−" or "+" next to the doping type "n" or "p". By way of example, "n$^-$" indicates a doping concentration which is lower than the doping concentration of an "n"-type doping region, while in an "n$^+$"-type doping region the doping concentration is higher than in an "n"-type doping region. Doping regions of the same relative doping concentration do not necessarily have the same absolute doping concentration. By way of example, two different "n"-type doping regions can have the same doping concentration or different absolute doping concentrations. The term "dopant concentration" denotes a net dopant concentration, provided that nothing to the contrary is evident from the context.

The expression "electrical connected" describes a low-impedance connection between the electrically connected elements, for example a direct contact between the relevant elements or a connection via a metal and/or a highly doped semiconductor. The expression "electrically coupled" includes the fact that one or more intervening elements suitable for signal transmission can be present between the "electrically coupled" elements, e.g. elements which are controllable such that they can produce at times a low-impedance connection in a first state and a high-impedance decoupling in a second state.

If a value range with the indication of one limit value or two limit values is defined for a physical variable, then the propositions "from" and "to" or "less" and "more" include the respective limit value. An indication of the type "from . . . to" is accordingly understood as "from at least . . . to at most". Correspondingly, an indication of the type "less . . . " ("more . . . ") is understood as "at most . . . " ("at least . . . ").

FIG. 1 shows a semiconductor component 500, which can be for example an IGFET (insulated gate field effect transistor), for example a MOSFET (metal oxide semiconductor FET), wherein the abbreviation MOSFET encompasses both FETs having a metallic gate electrode and FETs having semiconductor gate electrodes, a semiconductor diode, e.g. a pn diode or an MPS (merged pin Schottky) diode, an IGBT (insulated gate bipolar transistor) or an MCD (MOS-controlled diode).

The semiconductor component 500 is based on a semiconductor body 100 formed with silicon carbide. By way of example, the semiconductor body 100 comprises or consists of a silicon carbide crystal, wherein the silicon carbide crystal can comprise doping atoms and/or impurities, e.g. hydrogen and/or oxygen atoms, besides the main constituents of silicon and carbon. The polytype of the silicon carbide crystal can be for example 2H, 6H, 15R or 4H.

A first surface 101 on the front side of the SiC semiconductor body 100 is planar or ribbed. A normal 104 to a planar first surface 101 or to a central plane of a ribbed first surface 101 defines a vertical direction. Directions parallel to a planar first surface 101 or to the central plane of a ribbed first surface 101 are horizontal and lateral directions.

There is formed in the SiC semiconductor body 100 a field effect transistor structure having a gate structure 150 at a first surface 101 of the SiC semiconductor body 100 and a drift zone 131 of a first conductivity type. A zone 133 of the first conductivity type can be formed in the vertical direction between a semiconductor region 120, 160 of a second conductivity type and the drift zone 131, which zone of the first conductivity type can be spaced apart from the gate structure 150 and can be at a maximal distance of 1 μm from the semiconductor region 120, 160 in the vertical direction. It is possible for the zone 133 to directly adjoin the semiconductor region 120, 160.

By way of example, the field effect transistor structure comprises a transistor cell TC on the front side of the SiC semiconductor body 100. The transistor cell TC can comprise a source region 110 of the first conductivity type, which can be electrically connected to a first load terminal L1 of the semiconductor component 500. The transistor cell TC can be a lateral transistor cell having a planar gate structure 150 formed on the first surface 101, or a vertical transistor cell having a gate structure 150 formed in a trench.

The gate structure 150 can comprise a gate electrode 155, which is electrically connected to a gate terminal G of the semiconductor component 500.

The semiconductor region 120, 160 of the second conductivity type formed between the first surface 101 and the drift structure 130 can comprise for example a body region 120 of the transistor cell TC and/or a diode region 160. The semiconductor region 120, 160 can be connected to the first load terminal L1. By way of example, the semiconductor region 120, 160 can extend as far as a contact at the first surface.

The drift zone 131 can be part of a drift structure 130 formed between the transistor cell TC and a second surface 102 on the rear side of the SiC semiconductor body 100, said second surface being situated opposite the first surface 101. The drift structure 130 can comprise a highly doped contact layer 139 extending directly along the second surface 102. The highly doped contact layer 139 is electrically connected to a second load terminal L2 of the semiconductor component 500. A vertical extent of the contact layer 139 can be more than 50 μm, e.g. more than 100 μm. The weakly doped drift zone 131 is formed between the transistor cells TC and the highly doped contact layer 139.

First pn junctions pn1 between the semiconductor regions 120, 160 and the drift structure 130 form at least sections of an intrinsic body diode BD of the semiconductor component 500.

If the intrinsic body diode BD is turned off, then a gate potential applied to the gate terminal G controls a unipolar charge carrier flow through the body regions 120 of the transistor cells TC. If the intrinsic body diode BD is forward-biased, a bipolar charge carrier flow of holes and electrons can be established between the semiconductor region 120, 160 and the drift structure 130, provided that the transistor channel is completely closed and/or the current in the forward direction exceeds a threshold value.

The embodiments described below concern the lowering of the emitter efficiency of the intrinsic body diode BD on the part of the semiconductor regions 120, 160, i.e., in the case of p-doped semiconductor regions 120, 160, the anode emitter efficiency. The anode emitter efficiency $\gamma_{Anode}$ is a measure of the hole current injected into the weakly doped drift zone 131. By way of example, the contact resistance of a metal-semiconductor junction between the first load terminal L1 and the semiconductor region 120, 160 and also the absolute value and profile of the dopant concentrations at the pn junction pn influence the anode emitter efficiency $\gamma_{Anode}$.

The zone 133 of the conductivity type of the drift zone 131, said zone being formed between the semiconductor region 120, 160 and the drift zone 131, has a dopant concentration that is at least double the magnitude of that in sections of the drift zone 131 which adjoin the zone 133. By way of example, a maximum dopant concentration in the zone 133 is at least double the magnitude of, e.g. five times higher than, a minimum dopant concentration in the drift zone 131. At the location of the maximum dopant concentration, the zone 133 can be partly compensated with dopants of the second conductivity type. The dopant dose of the zone 133 can lie in a range of from 5% to 20% of the breakdown charge of SiC.

The zone 133 can be at least partly doped with at least one dopant having a deep energy level with a gap of at least 150 meV with respect to the closest band edge. Such a dopant is phosphorus, chromium or iridium, for example.

The zone 133 can be at a vertical and/or lateral distance from the gate structure 150 of the transistor cell TC, such that a unipolar charge carrier flow that flows through the body region 120 in the on state of the transistor cell TC does not directly enter the zone 133.

In accordance with one embodiment, the zone 133 is formed such that no or only a slight proportion of the switch-on current of the transistor cell TC flows through the zone 133. In accordance with another embodiment, the switch-on current of the transistor cell TC between the body region 120 and the zone 133 passes through a current distribution zone of the conductivity type of the drift zone 131, wherein the current distribution zone can be directly adjacent to the body region 120 or else be spaced apart from the latter, takes up the unipolar charge carrier flow through the body region 120 and distributes it at least partly via the zone 133 towards the drift zone 131. In this case, a dopant concentration in the current distribution zone is at least double the magnitude of that in the drift zone 131, e.g. at least five times the magnitude thereof.

The zone 133 can directly adjoin the doped semiconductor region 120, 160 or be spaced apart from the latter. A distance between the zone 133 and the semiconductor region 120, 160 can be for example up to 1 µm for components having a low nominal blocking capability and even up to 3 µm for components having a higher nominal blocking capability. The semiconductor region 120, 160 can extend as far as an electrical contact formed at the first surface 101 of the SiC semiconductor body 100 or can adjoin a trench contact extending into the SiC semiconductor body 100.

The semiconductor region 120, 160 can be the body region 120 or a diode region 160. An average dopant concentration in the diode region 160 can be at least double the magnitude of that in the body region 120. Furthermore, it is possible for the diode region 160 to be directly adjacent to the body region 120.

The zone 133 can significantly reduce the emitter efficiency and thus also the hole injection in on-state operation of the intrinsic body diode BD. Thus, in forward operation of the intrinsic body diode BD, the plasma flooding of the SiC semiconductor body 100 decreases and significantly fewer charge carriers recombine within the drift zone 131. Stacking faults that otherwise propagate in the SiC crystal owing to local evolution of heat attributed to the recombination of charge carriers in the SiC crystal are thus reduced as well. Operation of the body diode BD can accordingly remain without influence or almost without influence on the on resistance RDSon of the semiconductor component, which can otherwise rise gradually as a result of the constant new formation of crystal defects during operation of the semiconductor component and lead to unacceptable component degradation.

The intrinsic body diode BD of such a semiconductor component 500 can accordingly replace an external freewheeling diode, for example, without the operation of the intrinsic body diode BD adversely affecting the long-term stability of the component properties. In addition, the steepening of the electric field that is brought about by the zone 133 can result in more reliable pinning of the avalanche breakdown within the cell array.

A possible slight increase—attributed to the reduced hole injection—in the forward voltage of the intrinsic body diode BD in the range of from e.g. 1 V to 2 V remains insignificant in applications in which the intrinsic body diode BD is operated in the on state only for a comparatively short time per switching cycle. One such application is e.g. the operation of the intrinsic body diode BD as a freewheeling diode in a bridge circuit in which the body diode BD is operated in the forward direction only during a dead time in the course of the commutation of the bridge circuit.

A vertical extent of the zone 133 is relatively small, for example between 50 nm and 1 µm or between 200 nm and 500 nm, such that the influence of the zone 133 on the blocking capability of the semiconductor component 500 can remain small. The dopant dose of the zone 133 can be 5% to 20% of the breakdown charge of the material of the SiC semiconductor body 100, which typically lies between 1 and $2 \times 10^{13}$ cm$^{-2}$ depending on the drift zone doping. The entire zone 133 or at least one vertical section of the zone 133, e.g. in the region of the maximum dopant concentration, can be partly counter-compensated with dopants of the second conductivity type. A suitable doping in the zone 133 can locally steepen and "pin" the electrical field and thus improve the avalanche behaviour of the semiconductor component 500.

In accordance with one embodiment, the dopants in the zone 133 can be or contain those with a deep energy level in the band gap, for example phosphorus, chromium and/or iridium. The presence of a dopant with a deep energy level can lead to a pronounced positive temperature coefficient of the forward voltage of the body diode since the zone 133 thus doped is initially only partly activated at room temperature T0 even in the flooded state and the degree of activation can rise significantly as the temperature increases. The positive temperature coefficient of the forward voltage counteracts the rise in the emitter efficiency and also the defect growth linked thereto. Moreover, the zone 133 brings about a flattening of the rise in the on resistance RDSon as the temperature rises.

The charge carrier mobility can moreover be reduced in a section of the SiC semiconductor body 100 that comprises the zone 133. By way of example, the zone 133 or a section of the SiC semiconductor body 100 that comprises the zone 133 can have a counter-doping, for instance aluminium, boron and/or gallium atoms, which partly compensates the actual n-type doping, for which reason, on the other hand, the n-type doping must be increased in order to obtain the same net doping.

Figure 2A:
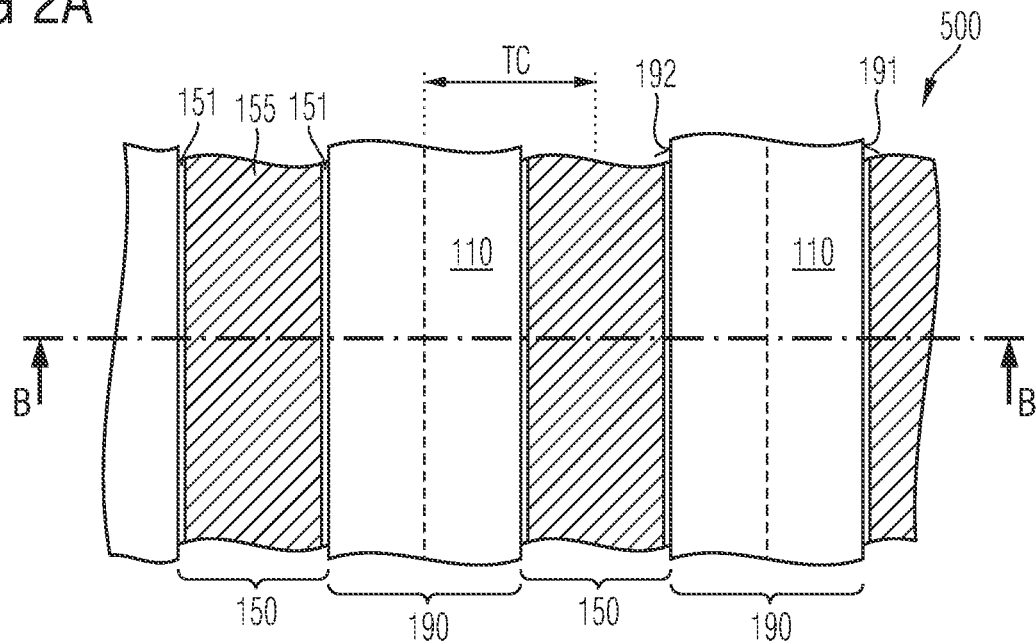
FIG. 2A is a schematic horizontal cross section through a section of a SiC semiconductor component in accordance with one embodiment comprising strip-like field effect transistor structures and comprising zones for reducing the emitter efficiency of an intrinsic body diode, wherein the zones are aligned with semiconductor regions of the conductivity type of body regions.
Figure 2B:
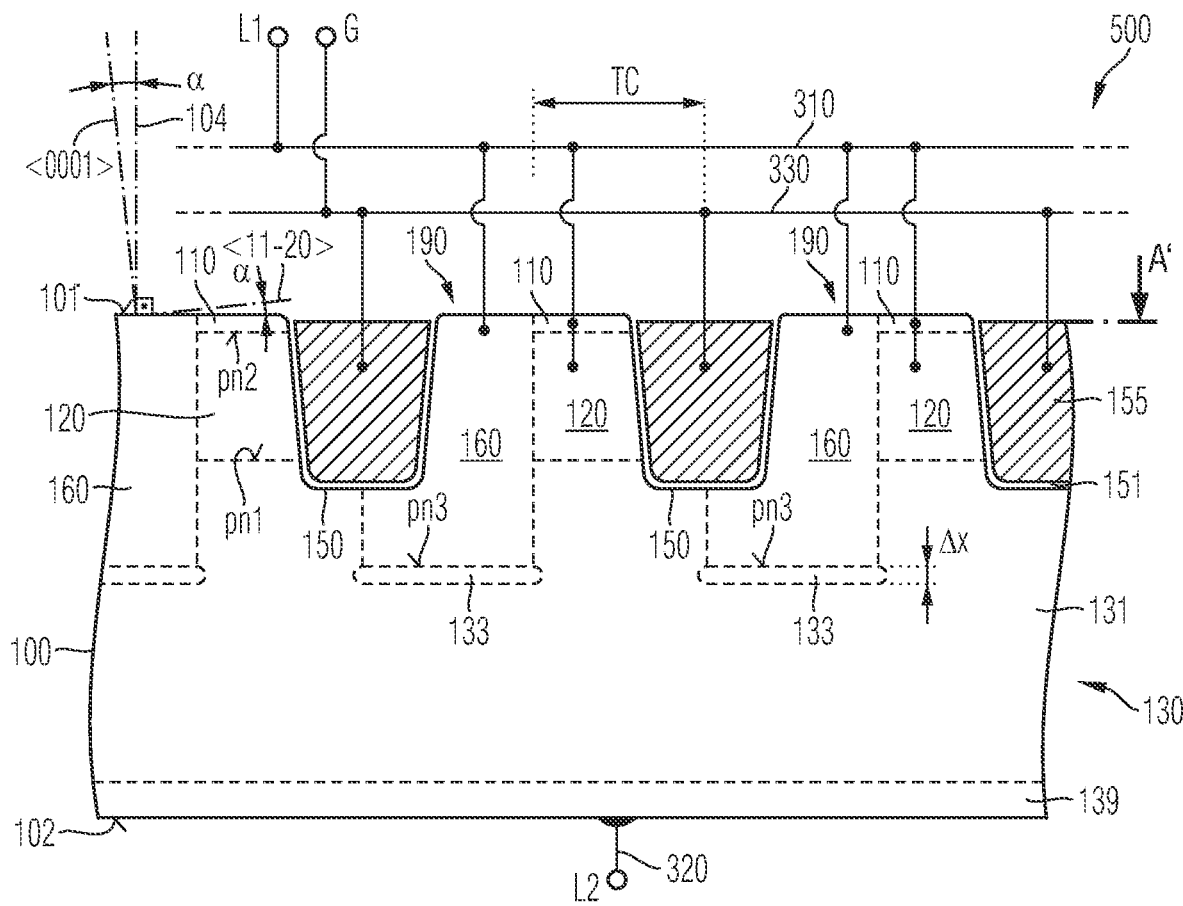
FIG. 2B is a schematic vertical cross section through the section of the SiC semiconductor component according to FIG. 2A along the cross-sectional line B-B'.

FIGS. 2A and 2B relate to embodiments of semiconductor components 500 comprising a SiC semiconductor body 100 and comprising strip-like gate structures 150 formed in trenches. For details of the SiC semiconductor body 100, reference is made to the description concerning FIG. 1.

On a front side, the SiC semiconductor body 100 has a first surface 101, which can comprise coplanar surface sections. The first surface 101 can coincide with a principal crystal plane or extend at an off-axis angle α obliquely with respect to a principal crystal plane, wherein the off-axis angle can be at least 2° and at most 12°, e.g. approximately 4°.

In the embodiment illustrated, the <0001> crystal axis is inclined by an off-axis angle α with respect to the normal 104. The <11-20> crystal axis is inclined by the same off-axis angle with respect to the horizontal plane. The <1-100> crystal axis is orthogonal to the cross-sectional plane.

On the rear side, the SiC semiconductor body 100 has a second surface 102 parallel to the first surface 101. A distance between the first surface 101 on the front side and the second surface 102 on the rear side depends on the nominal blocking ability of the semiconductor component 500.

A highly doped contact layer 139 adjoining the second surface 102 of the SiC semiconductor body 100 can be or comprise a substrate section sliced from a single crystal. The contact layer 139 forms an ohmic contact with a second load electrode 320, which can directly adjoin the second surface 102. Along the second surface 102, the dopant concentration of the contact layer 139 is high enough to form an ohmic contact with the second load electrode 320.

If the semiconductor component 500 is a MOSFET or if the semiconductor component 500 comprises such a MOSFET, then the contact layer 139 has the conductivity type of the drift zone 131. If the semiconductor component 500 is an IGBT, then the contact layer 139 has the conductivity type complementary to that of the drift zone 131 or comprises zones of both conductivity types.

The drift zone 131 can be formed in a layer grown by epitaxy on the contact layer 139. An average dopant concentration in the drift zone 131 lies for example in a range of from $10^{14}$ cm$^{-3}$ to $5\times10^{16}$ cm$^{-3}$. Besides the drift zone 131 and the contact layer 139, the drift structure 130 can comprise further doped regions, for example field stop zones, blocking and/or barrier zones and/or current distribution zones of the conductivity type of the drift zone 131 and/or insular regions of the complementary conductivity type.

The drift zone 131 can directly adjoin the contact layer 139. In accordance with one embodiment, the drift zone 131 forms an n$^-$/n junction with a buffer layer formed between the drift zone 131 and the contact layer 139, wherein a vertical extent of the buffer layer can be at least 0.3 µm and maximal 10 µm, e.g. between 0.5 µm and 5 µm, and an average dopant concentration in the buffer layer can lie in a range of from $10^{17}$ cm$^{-3}$ to $3\times10^{18}$ cm$^{-3}$ or in a range of from $2\times10^{17}$ cm$^{-3}$ to $1\times10^{18}$ cm$^{-3}$. The buffer layer can reduce mechanical stress in the SiC semiconductor body 100 and/or influence the electric field in the drift structure 130 in a predetermined manner.

The transistor cells TC on the front side of the SiC semiconductor body 100 are formed along gate structures 150 extending from the first surface 101 into the SiC semiconductor body 100, wherein mesa sections 190 of the SiC semiconductor body 100 separate adjacent gate structures 150 from one another.

A longitudinal extent of the gate structures 150 along a first horizontal direction is greater than a width of the gate structures 150 along a second horizontal direction orthogonal to the first horizontal direction and transverse to the longitudinal extent. The gate structures 150 can be long trenches extending from one side of a cell array region comprising the transistor cells TC as far as an opposite side, wherein the length of the gate structures 150 can be up to a plurality of 100 µm, for example up to a plurality of millimetres.

In accordance with other embodiments, the gate structures 150 can be formed along parallel lines extending in each case from one side of the cell array region to the opposite side, and wherein a multiplicity of gate structures 150 separated from one another are formed in each case along the same line. The gate structures 150 can also form a lattice with mesa sections 190 in the meshes of the lattice.

At the underside, the gate structures 150 can be rounded, in particular at a transition from a sidewall of the gate structure 150 to a bottom of the gate structure 150. By way of example, a radius of curvature is at least double the thickness of a gate dielectric 151, described below, in the gate structures 150.

The gate structures 150 can be uniformly spaced apart from one another, can have the same width and can form a regular pattern, wherein a pitch (centre-to-centre distance) of the gate structures 150 can lie in a range of from 1 µm to 10 µm, e.g. of from 2 µm to 5 µm. A vertical extent of the gate structures 150 can lie in a range of from 300 nm to 3 µm, e.g. in a range of from 500 nm to 1 µm.

Sidewalls of the gate structures 150 can be aligned vertically with respect to the first surface 101 or can be tilted slightly relative to the vertical direction, wherein opposite sidewalls can extend parallel to one another or towards one another. In accordance with one embodiment, the width of the gate structures 150 decreases with increasing distance from the first surface 101. By way of example, the one sidewall deviates from the vertical by approximately the off-axis angle α and the other sidewall by −α.

In accordance with one embodiment, the mesa sections 190 comprise two opposite longitudinal mesa sidewalls 191, 192, which directly adjoin two adjacent gate structures 150. At least one first mesa sidewall 191 lies in a principal crystal plane with high charge carrier mobility, e.g. in a {11-20} crystal plane. The second mesa sidewall 192 situated opposite the first mesa sidewall 191 can be inclined by double the off-axis angle α, for example by approximately 8 degrees, with respect to the relevant principal crystal plane.

A conductive gate electrode 155 in the gate structures 150 can comprise a highly doped polycrystalline silicon layer, an integral or multipartite metal structure or both. The gate electrode 155 can be electrically connected to a gate metallization 330, which forms a gate terminal G or is electrically connected or coupled to such a gate terminal.

Along at least one side of the gate structure 150, a gate dielectric 151 separates the gate electrode 155 from the SiC semiconductor body 100. The gate dielectric 151 can comprise a semiconductor dielectric, for example a thermally grown or deposited semiconductor oxide, e.g. silicon oxide, a semiconductor nitride, for example a deposited or thermally grown silicon nitride, a semiconductor oxynitride, for example a silicon oxynitride, some other deposited dielectric material or an arbitrary combination of the materials mentioned. The layer thickness of the gate dielectric 151 can be chosen such that a threshold voltage of the transistor cells TC lies in a range of from 1 V to 8 V or between 3 V and 6 V.

The gate structures 150 can exclusively comprise the gate electrode 155 and the gate dielectric 151 or, in addition to the gate electrode 155 and the gate dielectric 151, can comprise further conductive and/or dielectric structures, e.g. compensation structures, field plates or isolating dielectrics.

In the mesa sections 190, source regions 110 are formed towards the front side of the SiC semiconductor body 100, which source regions can directly adjoin the first surface 101 and both mesa sidewalls 191, 192 at the longitudinal sides of the respective mesa section 190. In this case, each mesa section 190 can comprise a source region 110 having sections connected to one another in the SiC semiconductor body 100 or having at least two sections separated from one another in the SiC semiconductor body 100 on mutually opposite sides of the mesa section 190 which are connected to one another with low impedance via a contact or trench contact adjoining the mesa section 190.

The mesa sections 190 furthermore comprise body regions 120, which separate at least sections of the source regions 110 from the drift structure 130, and form first pn junctions pn1 with the drift structure 130 and second pn junctions pn2 with the source regions 110. The body regions 120 directly adjoin at least the first mesa sidewall 191. A vertical extent of the body regions 120 corresponds to a channel length of the transistors cells TC and can lie in a range of from 200 nm to 2500 nm or in a range of from 400 nm to 1000 nm. Both the source regions 110 and the body regions 120 are electrically connected to a first load electrode 310 on the front side of the SiC semiconductor body 100.

The first load electrode 310 can form a first load terminal L1, which can be an anode terminal of an MCD, a source terminal of a power MOSFET, of some other IGFET, or an emitter terminal of an IGBT, or can be electrically connected or coupled to the first load terminal L1. The second load electrode 320 on the rear side can form a second load terminal L2, which can be a cathode terminal of an MCD, a drain terminal of a power MOSFET, of some other IGFET, or a collector terminal of an IGBT, or be electrically connected or coupled to the second load terminal L2.

Diode regions 160 can be formed between the body regions 120 and the second mesa sidewalls 192, wherein a maximum dopant concentration in the diode regions 160 along the second mesa sidewalls 192 is higher, e.g. at least two times or even also ten times higher, than a dopant concentration in the body regions 120 along the first mesa sidewalls 191.

In accordance with one embodiment, the transistor cells TC are n-channel FET cells having p-doped body regions 120, n-doped source regions 110 and an n-doped drift zone 131. In accordance with another embodiment, the transistor cells TC are p-channel FET cells having n-doped body regions 120, p-doped source regions 110 and a p-doped drift zone 131.

A load current that flows through the SiC semiconductor body 100 between the first and second load electrodes 310, 320 in the on state of the semiconductor component 500 passes through the body regions 120 as a charge carrier flow in inversion channels induced along the gate dielectric 151. The higher dopant concentration in the diode regions 160 in comparison with the dopant concentration in the body regions 120 can prevent the formation of inversion channels along the second mesa sidewalls 192, protect the gate dielectric 151 at the bottom of the gate structures 150 against degradation and/or connect the diode regions 160 to the first load electrode 310 with low impedance.

The diode regions 160 extend e.g. as far as a contact formed at the first surface 101 or as far as a trench contact extending from the first surface 101 into the respective mesa section 190 and are electrically connected or coupled to the first load electrode 310. The diode regions 160 can vertically overlap the gate structures 150, wherein sections of the diode regions 160 are formed in the vertical projection of the gate structures 150. A maximum concentration in the diode regions 160 is higher than a maximum concentration in the body regions 120.

In the body regions 120, the maximum dopant concentration can be close beneath the first surface 101. In the diode regions 160, the dopant concentration can also have, besides an absolute maximum (i.e. global maximum relative to the respective diode region 160) near the first surface 101, a local maximum in the deepest region relative to the first surface 101 and below a lower edge of the gate structures 150. In an off state of the semiconductor component 500, the sections of the diode regions 160 below the gate structures 150 can shield critical regions of the gate dielectric 151 against a high electric field at the first pn junction pn1. A distance between opposite edges of adjacent diode regions 160 can lie in a range of from 300 nm to 5 µm, for example in a range of from 500 nm to 2 µm.

The diode regions 160 form third pn junctions pn3 with the drift structure 130. The first and third pn junctions pn1 and pn3 form sections of an intrinsic body diode.

Zones 133 of the conductivity type of the drift zone 131 are formed between the diode regions 160 and the drift zone 131 and, in the exemplary embodiment shown, in each case directly adjoin the diode regions 160 but, in accordance with other embodiments, can also be spaced apart from the diode regions 160 slightly, for example by less than 1 µm. A horizontal extent of the zones 133 can be less than, equal to or greater than the horizontal extent of the diode regions 160. A vertical extent Δx of the zones 133 can be at least approximately 50 nm and maximal approximately 1 µm. In this exemplary embodiment, the zones 133 are spaced apart from the drain-side end of the channel both laterally and vertically and reduce the anode emitter efficiency of the intrinsic body diode in the region of the third pn junctions pn3.

Figure 3A:
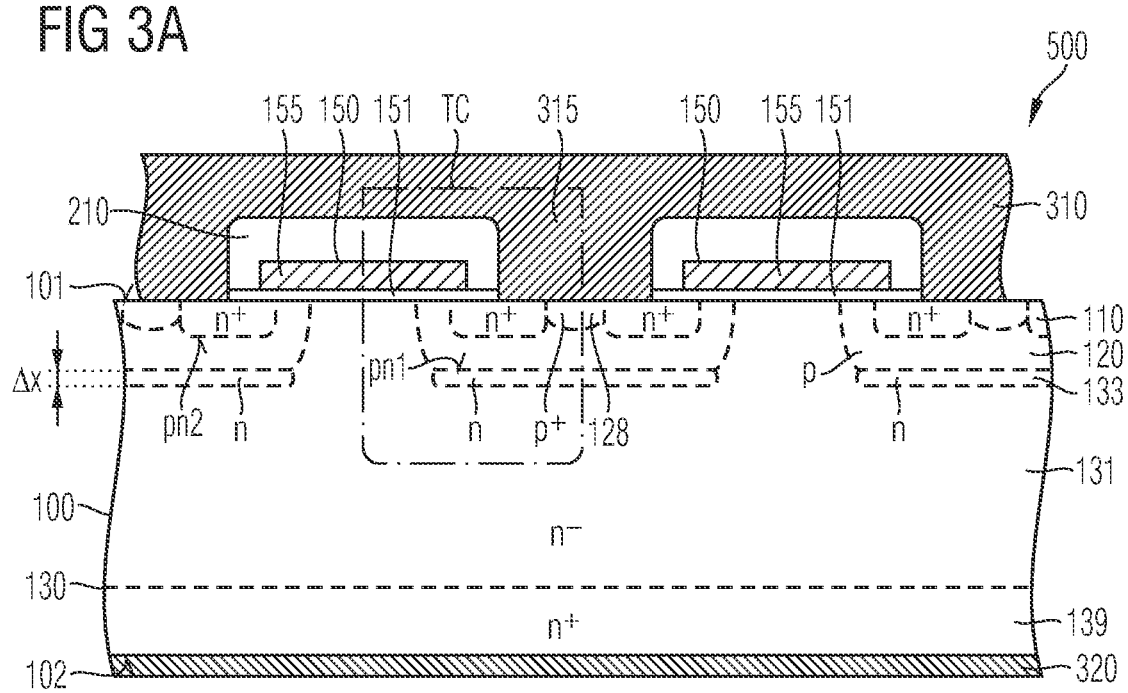
FIG. 3A is a schematic vertical cross section through a section of a SiC semiconductor component in accordance with one embodiment comprising planar gate structures and comprising zones aligned with body regions for reducing the emitter efficiency of an intrinsic body diode.

FIG. 3A shows a semiconductor component 500 comprising planar gate structures 150 on the front side of a SiC semiconductor body 100, wherein an individual gate structure 150 is assigned to two transistor cells TC formed symmetrically with respect to the gate structure 150.

The gate structures 150 in each case comprise a conductive gate electrode 155 and a gate dielectric 151, which is formed directly on the first surface 101 and separates the gate electrode 155 from the SiC semiconductor body 100. A body region 120 extending from a first surface 101 into the SiC semiconductor body 100 is assigned to two adjacent transistor cells TC of two adjacent gate structures 150. Source regions 110 of the two transistor cells TC extend from the first surface 101 into the body region 120 having a contact region 128. The contact region 128 can have a higher dopant concentration than a main part of the body region 120 outside the contact region 128. It is moreover possible for the contact region 128 to adjoin the first surface 101 between the source regions 110.

A drift structure 130 having a drift zone 131 and a contact layer 139 separates the transistor cells TC from a second surface 102 of the SiC semiconductor body 100, wherein the drift zone 131 can extend to the first surface 101 between adjacent body regions 120. A second load electrode 320 directly adjoins the second surface 102.

In the on state, the transistor cells TC, in channel regions of the body regions 120, form lateral inversion channels along the first surface 101 between the source regions 110 and the sections of the drift zone 131 that adjoin the first surface 101.

An interlayer dielectric 210 separates the gate electrode 155 from a first load electrode 310 on the front side of the SiC semiconductor body 100. Contacts 315 in openings of the interlayer dielectric 210 connect the first load electrode 310 to the contact regions 128 and the source regions 110.

Zones 133 which are spaced apart at least vertically from the gate structures 150 and in particular from the channel ends of the transistor cells TC are formed between the body regions 120 and the drift zone 131. The zones 133 can directly adjoin the body regions 120 or be spaced apart from the latter by at most 1 µm in the vertical direction. A vertical extent Δx of the zones 133 is at least approximately 50 nm and at most approximately 1 µm.

A horizontal extent of the zone 133 can correspond approximately to the horizontal extent of the body regions 120 or be larger or smaller. In accordance with one embodiment, instead of a plurality of zones 133 separated from one another, it is possible to form a single, continuous zone 133 extending continuously in a lateral direction over a plurality or all of the transistor cells TC of a cell array region.

Figure 3B:
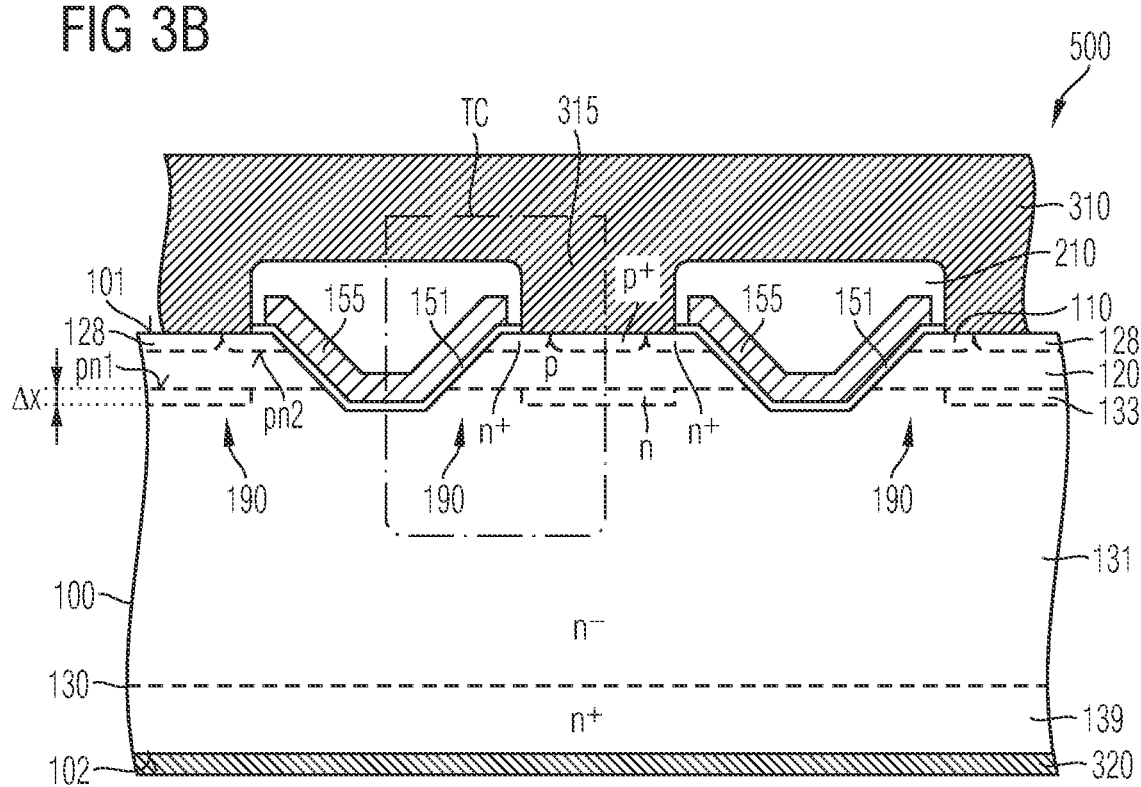
FIG. 3B is a schematic vertical cross section through a section of a SiC semiconductor component in accordance with one embodiment comprising shallow gate structures and comprising zones aligned with body regions for reducing the emitter efficiency of an intrinsic body diode.

In FIG. 3B, the gate structures 150 are formed in trenches having a v-shaped vertical cross-sectional area. The gate electrode 155 extends with an approximately uniform layer thickness along the sidewalls and the bottom of the trenches. Mesa sections 190 of the SiC semiconductor body 100 between adjacent gate structures 150 comprise source regions 110 formed along the first surface 101 and also body regions 120 between the source regions 110 and the drift structure 130.

Zones 133 of the conductivity type of the source regions 110 are formed between the body regions 120 and the drift zone 131 and are spaced apart laterally from the gate structures 150 and the channel ends of the transistor cells TC.

The semiconductor component 500 in FIG. 3C comprises gate structures 150 extending from a first surface 101 into a SiC semiconductor body 100, wherein the sidewalls of the gate structures 150 extend vertically with respect to the first surface 101. Body regions 120 are formed in mesa sections 190 of the SiC semiconductor body 100 between adjacent gate structures 150 and form first pn junctions pn1 with a drift structure 130 and second pn junctions pn2 with source regions 110 formed along the first surface 101.

An interlayer dielectric 210 separates a gate electrode 155 of the gate structures 150 from a first load electrode 310. Between adjacent gate structures 150, trench contacts 316 extend from the first load electrode 310 into the mesa sections 190, laterally contact the SiC semiconductor body 100 and connect the source regions 110 to the first load electrode 310. A vertical extent of a section of the trench contacts in the SiC semiconductor body 100 can approximately correspond to the vertical extent of the gate structures 150.

Diode regions 160 are formed below the trench contacts 316, which diode regions can be laterally adjacent to the body regions 120 and are connected to the trench contact 316 via a more highly doped diode contact region 169. A lateral extent of the diode regions 150 can be greater than a corresponding lateral extent of the trench contacts 316. The diode regions 160 form doped semiconductor regions of the conductivity type of the body regions 120, can extend along the sidewalls of the trench contacts 316 as far as the source regions 110 and form third pn junctions pn3 with the drift structure 130.

Zones 133 of the conductivity type of the drift zone 131 and having a dopant concentration that is at least double the magnitude of an average dopant concentration in the drift zone 131 are formed between the diode regions 160 and the drift zone 131. The zones 133 are spaced apart both vertically and laterally from the gate structures 150 and the channel ends of the transistor cells TC.

In FIG. 4, the semiconductor component 500 is a MOSFET based on a SiC semiconductor body 100 having gate structures 150 formed in trenches as described in FIGS. 2A to 2B, wherein the first load electrode 310 is connected to a source terminal S and the second load electrode 320 is connected to a drain terminal D.

An interlayer dielectric 210 composed of one or more layers above the gate structures 150 covers the gate electrode 155. The interlayer dielectric 210 can for example comprise a layer of thermal silicon oxide, of deposited silicon oxide, silicon nitride, silicon oxynitride or a glass, for example BSG (boron silicate glass), PSG (phosphorus silicate glass), PBSG (boron phosphorus silicate glass), FSG (fluorine silicate glass) or a spin-on glass or consist of such a layer. Contacts 315 extend through openings in the interlayer dielectric 210 and connect a first load electrode 310 bearing on the interlayer dielectric 210 to the source regions 110 and the body regions 120. On the rear side of the component, a second load electrode 320 contacts the second surface 102 with the contact layer 139.

Along the active sidewalls of the trench structures 150 the source regions 110 can in each case be directly adjacent to the trench structure 150 and be formed exclusively between the body region 120 and the first surface 101. In accordance with the embodiment illustrated, the source regions 110, besides a first section 111 along the active sidewalls, also comprise one or more second sections 112 which adjoin inactive sidewalls of the trench structures 150 and are formed in each case between diode region 160 and first surface 101. In the semiconductor body 110, the second sections 112 can for example be separated from the first sections 111 by the diode region 160 and/or the body region 120 or be connected to the first sections 111 via further sections of the same conductivity type.

The first load electrode 310, the second load electrode 320 and/or the contacts 315 can comprise aluminium (Al), copper (Cu) or alloys of aluminium and/or copper such as, for instance AlSi, AlCu or AlSiCu as main constituent. In accordance with other embodiments, at least one of the two load electrodes 310, 320 can contain nickel (Ni), titanium (Ti), tungsten (W), tantalum (Ta), vanadium (V), silver (Ag), gold (Au), tin (Sn), platinum (Pt) and/or palladium (Pd) as main constituent(s). At least one of the two load electrodes 310, 320 can comprise two or more partial layers, wherein each partial layer can contain Ni, Ti, V, Ag, Au, W, Sn, Pt and/or Pd as main constituent(s), e.g. a silicide, a nitride and/or an alloy. By way of example, the contacts 315 can comprise an interface layer 311 composed of a metal silicide, for example, and a main layer 312 composed of the material of the first load electrode 310, wherein the interface layer 311 adjoins the SiC semiconductor body 100 and separates the main layer 312 from the SiC semiconductor body 100.

The drift structure 130 comprises current distribution zones 137 of the conductivity type of the drift zone 131 between the body regions 120 and the drift zone 131. An average dopant concentration in the current distribution zones 137 is at least two times, for example at least ten times, the magnitude of an average dopant concentration in the drift zone 131. The reduced lateral ohmic resistance in the current distribution zones 137 spreads the charge carrier flow through the body regions 120 along the horizontal directions, such that even for comparatively low dopant concentrations in the drift zone 131 a largely uniform current distribution is established in the drift zone 131. The current distribution zones 137 directly adjoin the channel ends of the transistor cells TC.

The zone 133 is spaced apart from the gate structures 150 and thus also from the channel ends of the transistor cells TC. A vertical extent $\Delta x$ of the zone 133 is at least 50 nm and at most 1000 nm, for example at least 100 nm and at most 500 nm. An average net dopant concentration $n2$ in the zone 133 is higher than an average net dopant concentration $n1$ in the current distribution zone 137 and higher than an average net dopant concentration $n^-$ in the drift zone 131. The zone 133 can directly adjoin the diode regions 160 or be spaced apart from the diode regions 160 in the vertical direction, such that a first vertical section of the drift zone 131 separates the zone 133 from the diode regions 160.

The zone 133 extends continuously in a lateral direction over a plurality of adjacent transistor cells TC, for example over all the transistor cells TC of a cell array region enclosed by an edge termination region without transistor cells.

Figure 5:
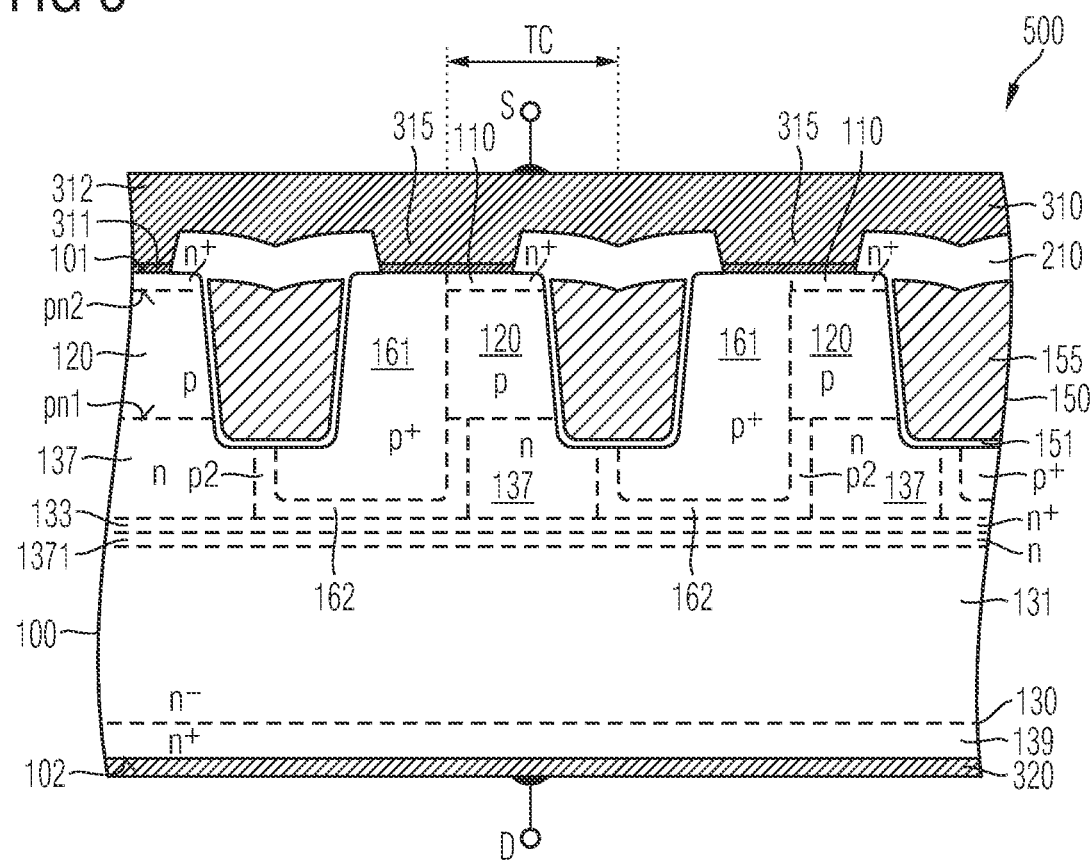
FIG. 5 is a schematic vertical cross section through a section of a SiC semiconductor component in accordance with one embodiment comprising deep gate structures and comprising a continuous zone—spaced apart from semiconductor regions of the conductivity type of body regions—of the conductivity type of the drift zone for reducing the emitter efficiency of an intrinsic body diode.

In FIG. 5, the diode regions 160 in each case comprise a first partial region 161 having a maximum of the dopant concentration near the first surface 101 and also a second partial region 162 having a local maximum of the dopant concentration in a region below the gate structures 150, wherein the first partial region 161 separates the second partial region 162 from the first surface 101. It is possible for the dopant concentration of a diode region 160 overall to have a local maximum in the second partial region 162 and/or to have a global maximum (relative to the respective diode region 160) in the first partial region 161 and between the local maximum and the first surface 101.

The first partial region 161 laterally adjoins the source region 110 and the body region 120 in the same mesa section 190 and also the inactive sidewall of the adjacent gate structure 150. The first partial region 161 can moreover also extend along a part of the bottom of the gate structure 150. The second partial region 162 separates the first partial region 161 laterally and vertically from the drift structure 130.

A maximum dopant concentration p2 in the second partial regions 162 of the diode regions 160 is lower than a maximum dopant concentration p+ in the first partial regions 161 and can be higher than in the body regions 120. The maximum dopant concentration p+ in the first partial regions 161 can be at least double, e.g. at least ten times, the maximum dopant concentration p2 in the second partial regions 162.

The zone 133 can directly adjoin the lower edge of the second partial regions 162 of the diode regions 160 and in this case extend in a lateral direction over a plurality of transistor cells TC, for example over all the transistor cells TC of a cell array region. Between the zone 133 and the drift zone 131, the drift structure 130 can comprise a current distribution layer 1371 having a dopant concentration which can be of a magnitude approximately equal to that in the current distribution zone 137.

Figure 6A:
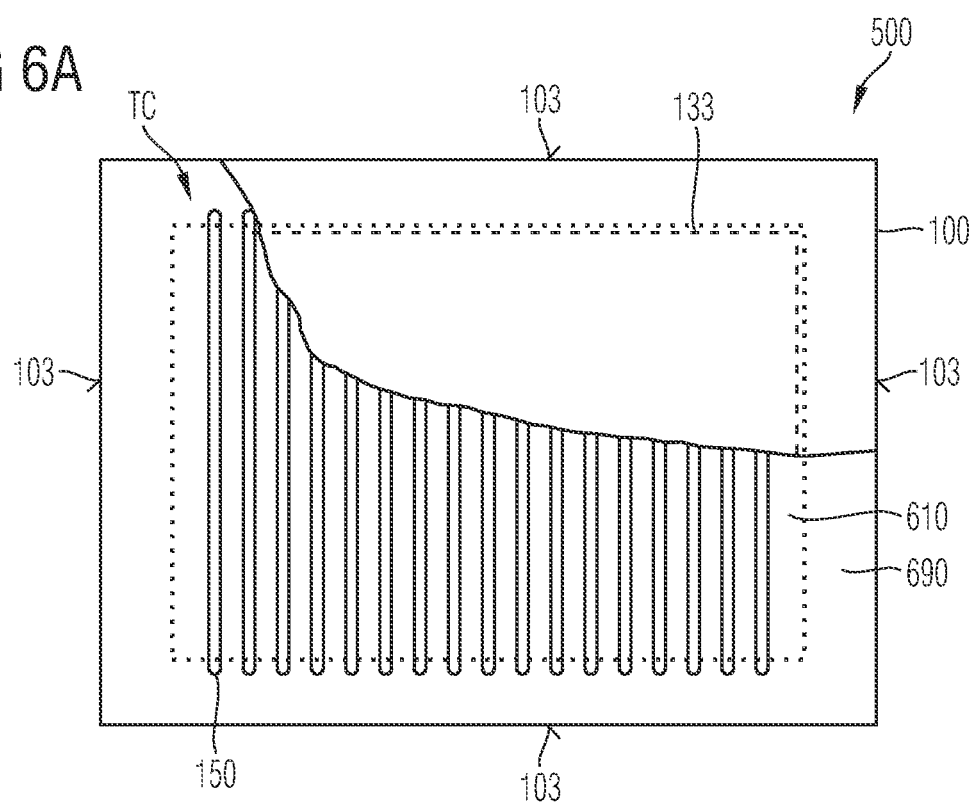
FIG. 6A is a schematic horizontal cross section through a SiC semiconductor component in accordance with one embodiment comprising a continuous zone extending over a cell array region for reducing the emitter efficiency of an intrinsic body diode.
Figure 6B:
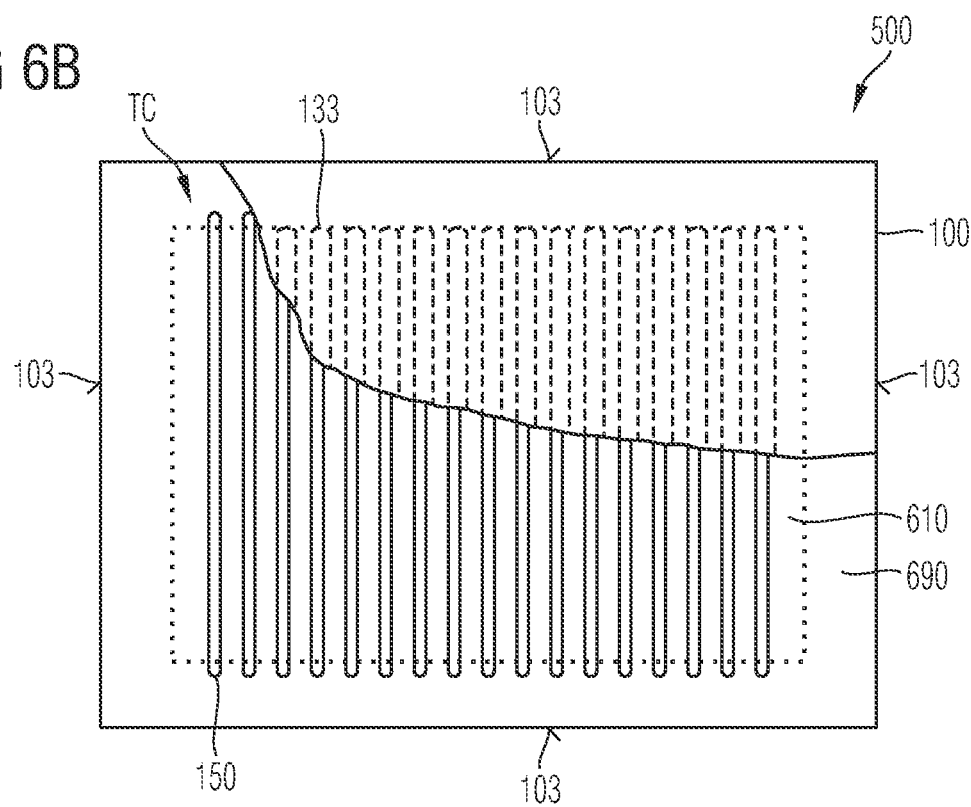
FIG. 6B is a schematic horizontal cross section through a SiC semiconductor component in accordance with one embodiment comprising a multiplicity of mutually separated zones aligned with semiconductor regions of the conductivity type of body regions for reducing the emitter efficiency of an intrinsic body diode.

FIGS. 6A and 6B show horizontal cross sections through the SiC semiconductor bodies 100 of two semiconductor components 500, respectively in a first horizontal plane intersecting the gate structures 150, and in a second horizontal plane intersecting the zone(s) 133.

The semiconductor components 500 in each case comprise a cell array region 610 and an edge termination region 690, which partly or completely encloses the cell array region 610 and separates it from a side surface 103 of the SiC semiconductor body 100 that connects the first and second surfaces 101, 102. All functional transistor cells TC of the semiconductor component 500 are formed in each case within the cell array region 610. The edge termination region 690 lacks functional transistor cells TC. An edge termination structure that laterally reduces an electric field can be formed in the edge termination region 690.

FIG. 6A shows a zone 133 extending at least over a large portion of the cell array region 610. The zone 133 can extend on all four sides of the cell array region 610 into an inner partial region of the edge termination region 690 or can be completely absent in the edge termination region 690. Thus, a loss of one-dimensional blocking capability in the cell array region 610 that is possibly attributable to the zone 133 can be smaller than a loss of blocking capability that is caused by the edge termination.

FIG. 6B shows a semiconductor component 500 comprising strip-like transistor cells TC formed along strip-like gate structures 150 arranged in trenches. The semiconductor component 500 comprises a plurality of mutually separated zones 133 which are formed substantially parallel to one another and in a manner partly overlapping the gate structures 150, wherein the zones 133 are structured in accordance with the pattern of the transistor cells TC.

Figure 7:
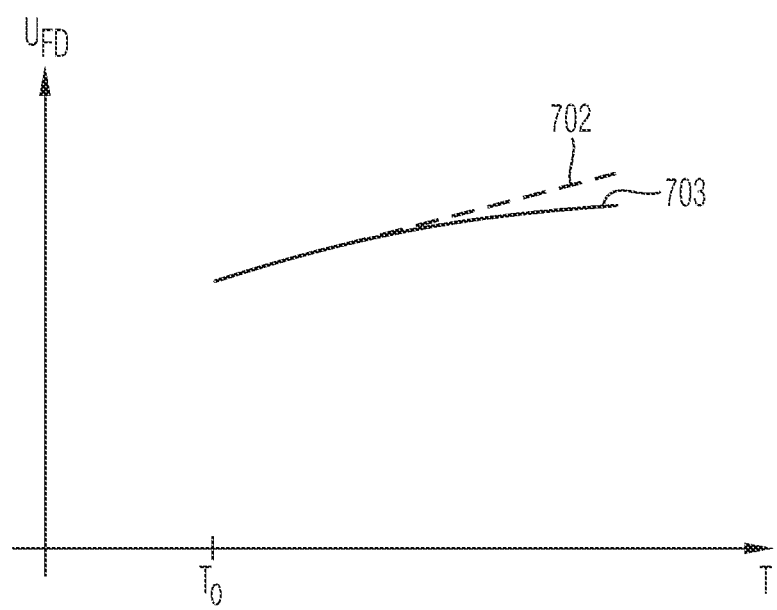
FIG. 7 is a simplified diagram for illustrating the temperature response of the emitter efficiency of an intrinsic body diode for elucidating the embodiments.

In FIG. 7, the characteristic curve 703 shows the rise of the forward voltage $U_{FD}$ as the temperature rises for a semiconductor component comprising a continuous zone 133 and comprising diode regions 160 in accordance with FIG. 5, wherein the dopants in the zone 133 comprise those having a deep energy level in the band gap, for example phosphorus, chromium and/or iridium. Between adjacent diode regions 160, the dopants having a deep energy level reduce the emitter efficiency as the temperature rises, with the result that the rise in the forward voltage $U_{FD}$ with temperature turns out to be flatter than in the case of a hypothetical, otherwise identical reference component without a zone, for which the characteristic curve 702 shows the steeper rise in the forward voltage $U_{FD}$ as the temperature rises.

Figure 8A:
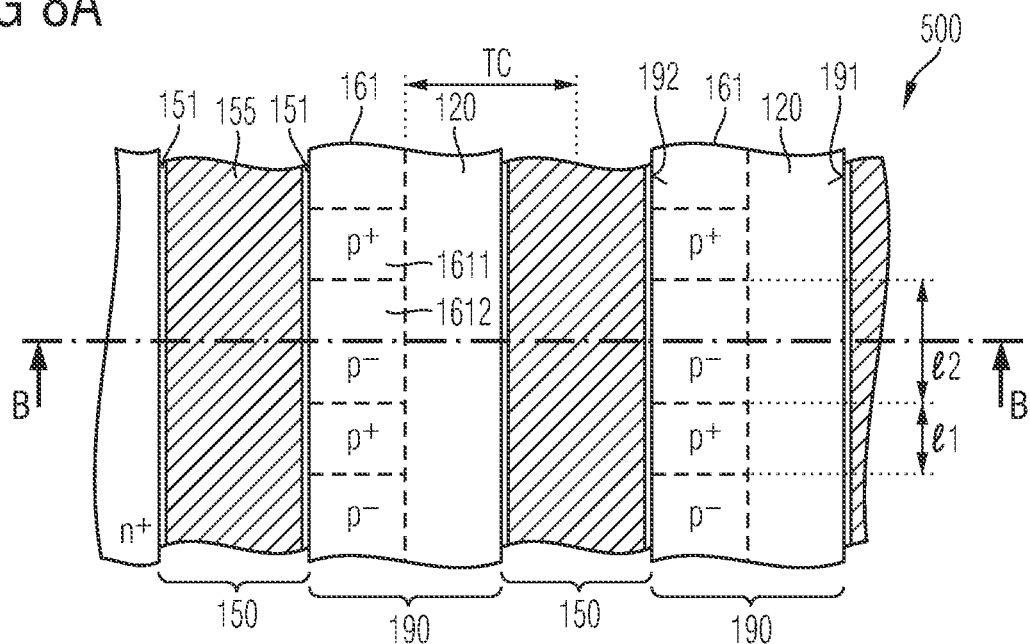
FIG. 8A is a schematic horizontal cross section through a section of a SiC semiconductor component comprising strip-like field effect transistor structures in accordance with one embodiment comprising more weakly doped zones of the conductivity type of the body regions, said zones being formed along a cell longitudinal axis and being separated from one another.
Figure 8B:
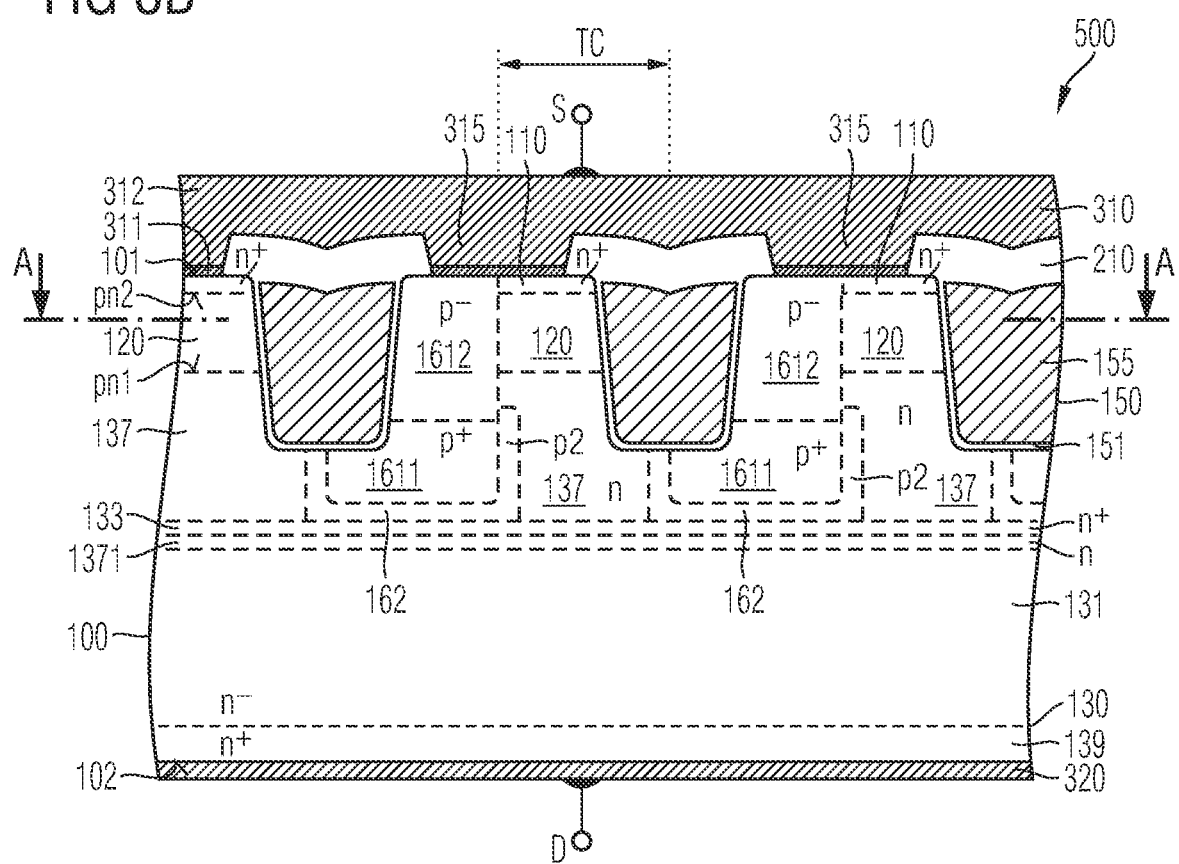
FIG. 8B is a schematic vertical cross section through the section of the SiC semiconductor component according to FIG. 8A along the cross-sectional line B-B'.

In the semiconductor component 500 in FIGS. 8A and 8B, the diode region 160 comprises sections 1611, 1612 having dopant concentrations of varying magnitude, said sections being arranged alternately along a longitudinal direction of the gate structures 150. In the exemplary embodiment shown, the first partial region 161 of the diode region 160 comprises a highly doped first section 1611, which comprises a continuous lower partial section and a multiplicity of upper partial sections that alternate with weakly doped second sections 1612 along the longitudinal axis of the mesa sections 190. Thus, at least the first partial regions 161 of the diode regions 160 have only comparatively narrow regions having a comparatively high p-type doping, which, on account of their small lateral extent, are activated only in the case of a surge current and improve the surge current strength of the intrinsic body diode. The weakly doped second sections 1612 can extend as far as the bottom of the first partial regions 161 of the diode regions 160. Alternatively, the dopant concentration in the second partial regions 162 can vary along the longitudinal direction of the gate structures 150.

A longitudinal extent 11 of the highly doped first sections 1611 along the longitudinal direction of the gate structures 150 can be approximately 100 nm to 1000 nm or approximately 200 nm to 500 nm. A longitudinal extent 12 of the weakly doped second sections 1612 along the longitudinal direction of the gate structures 150 is at least 500 nm and at most 5000 nm.

Figure 9A:
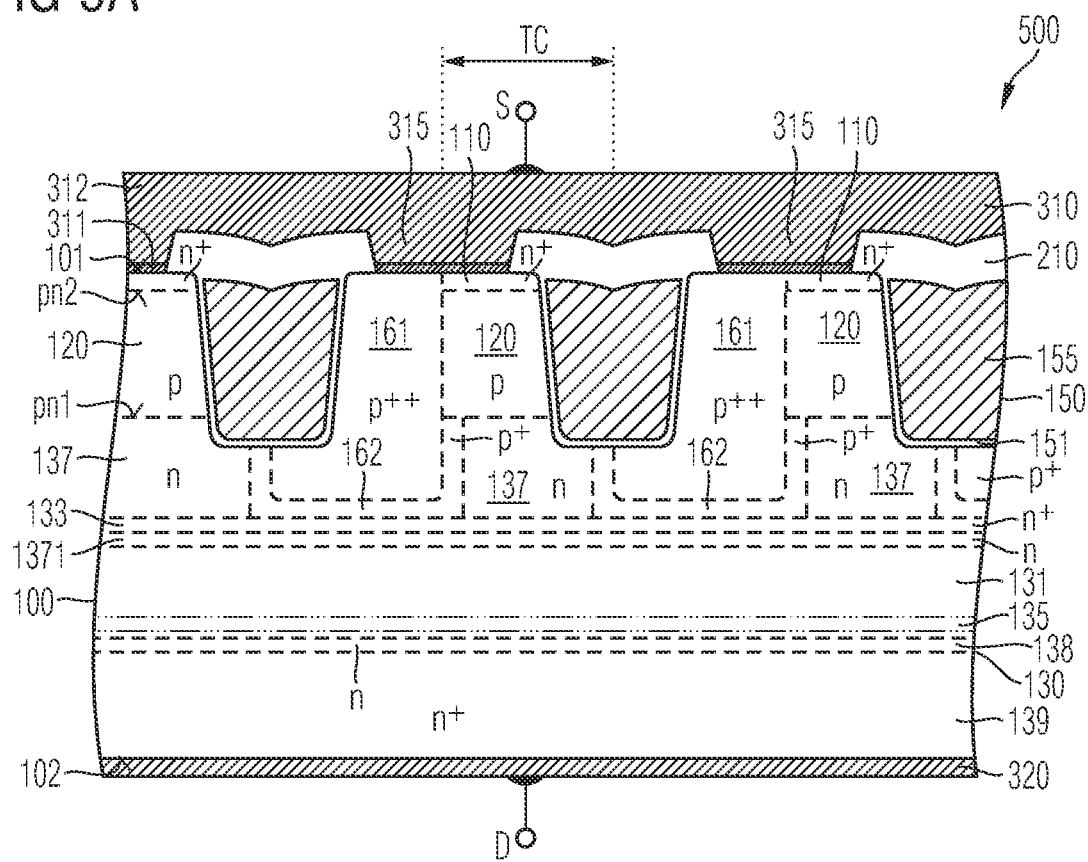
FIG. 9A is a schematic vertical cross section through a section of a SiC semiconductor component in accordance with one embodiment comprising a zone for reducing the emitter efficiency of an intrinsic body diode and a continuous recombination zone near the rear side of the component.

FIG. 9A shows a semiconductor component 500 comprising a recombination zone 135 formed between the zone 133 and the second surface 102 of the SiC semiconductor body 100. In the recombination zone 135, the density of recombination centres is greater than in sections of the SiC semiconductor body 100 outside the recombination zone 135. By way of example, within the recombination zone 135, the recombination rate is at least double the magnitude of that outside the recombination zone 135. In accordance with one embodiment, the recombination rate in the recombination zone 135 is at least ten times the recombination rate in a section of the drift zone 131 outside the recombination zone 135. The recombination centres comprise crystal lattice defects, heavy metal atoms, or both. The recombination zone 135 can be formed such that a space charge zone formed during the operation of the semiconductor component 500 within the absolute maximum ratings does not touch or overlap the recombination zone 135. By way of example, at least one section of a field stop/buffer layer 138 can be disposed upstream of the recombination zone 135 towards the first surface 101.

By way of example, the recombination zone 135 emerges from the implantation of hydrogen, helium and/or heavier ions, e.g. argon, germanium, silicon and/or carbon, wherein the implantation produces lattice defects in the crystal of the SiC semiconductor body 100 which are not completely annealed in subsequent heat treatments.

In accordance with another embodiment, the recombination centres in the recombination zone 135 comprise approximately positionally fixed heavy metal ions that diffuse extremely slowly in silicon carbide. The recombination centres can be provided from a single heavy metal or from at least two different heavy metals. Suitable heavy metals are molybdenum, tungsten, platinum, vanadium and gold, for example.

The recombination zone 135 can form a continuous horizontal layer or can be structured. By way of example, the recombination zone 135 can be absent in an edge termination region or be formed exclusively or predominantly in the edge termination region.

A vertical extent of the recombination zone 135 is at least 10 nm, for example at least 50 nm and at most 1 µm, for example at most 500 nm. If charge carriers recombine in the region of the recombination zone 135, the recombination takes place at the punctiform recombination centres. As a result of at least a large portion of the recombination events being shifted away from the crystal stacking faults and towards the punctiform recombination centres, the growth of crystal stacking faults in the cell array region is significantly reduced.

The recombination zone 135 is formed between the zone 133 and the second surface 102, for example within the drift zone 131. The recombination zone 135 can at least partly overlap a field stop/buffer layer 138 or else be implemented completely within the latter, wherein the field stop/buffer layer 138 is formed between the drift zone 131 and the contact layer 139. The field stop/buffer layer 138 can be of the conductivity type of the drift zone 131. An average dopant concentration in the field stop/buffer layer 138 is higher than in the drift zone 131 and lower than in the contact layer 139.

FIG. 9B relates to a semiconductor component 500 comprising an additional, further recombination zone 132, which is formed between the body region 120 and the recombination zone 135 and is spaced apart from the recombination zone 135. The further recombination zone 132 can be formed near the zone 133, adjoin the zone 133 or overlap the zone 133. In the further recombination zone 132, the density of recombination centres is greater than in sections of the SiC semiconductor body 100 outside the recombination zones 135, 132. By way of example, within the further recombination zone 132 the recombination rate is at least double the magnitude of that outside the recombination zones 135, 132. In accordance with one embodiment, the recombination rate in the further recombination zone 132 is at least ten times the recombination rate in a section of the drift zone 131 outside the recombination zones 132, 135. The recombination centres comprise crystal lattice defects, heavy metal atoms, or both.

The recombination zones 135, 132 can be formed such that a space charge zone formed during the operation of the semiconductor component 500 within the absolute maximum ratings does not touch or overlap any of the recombination zones 135, 132.

Depending on the desired blocking capability of the components, a vertical extent of the drift zone 131 is at least 3 µm or at least 8 µm and a dopant concentration in the drift zone 131 is maximal $5 \times 10^{16}$ cm$^{-3}$. A distance Δv between the recombination zone 135 and the further recombination zone 132 can be at least half or even 80% of a vertical extent Δw of the drift zone 131.

The semiconductor component 500 in FIG. 9C differs from that in FIG. 9B by virtue of the absent zone 133.

Figure 10A:
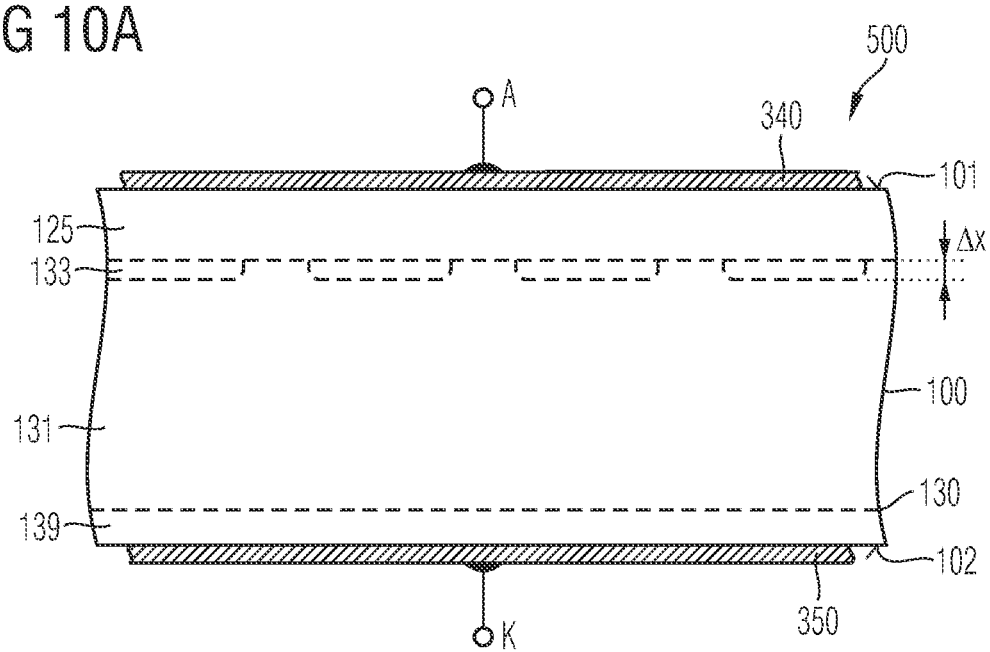
FIG. 10A is a schematic vertical cross section through a section of a SiC semiconductor component comprising zones for reducing the emitter efficiency in accordance with one embodiment concerning semiconductor components comprising a pn diode structure, wherein the zones adjoin an injection region.
Figure 10B:
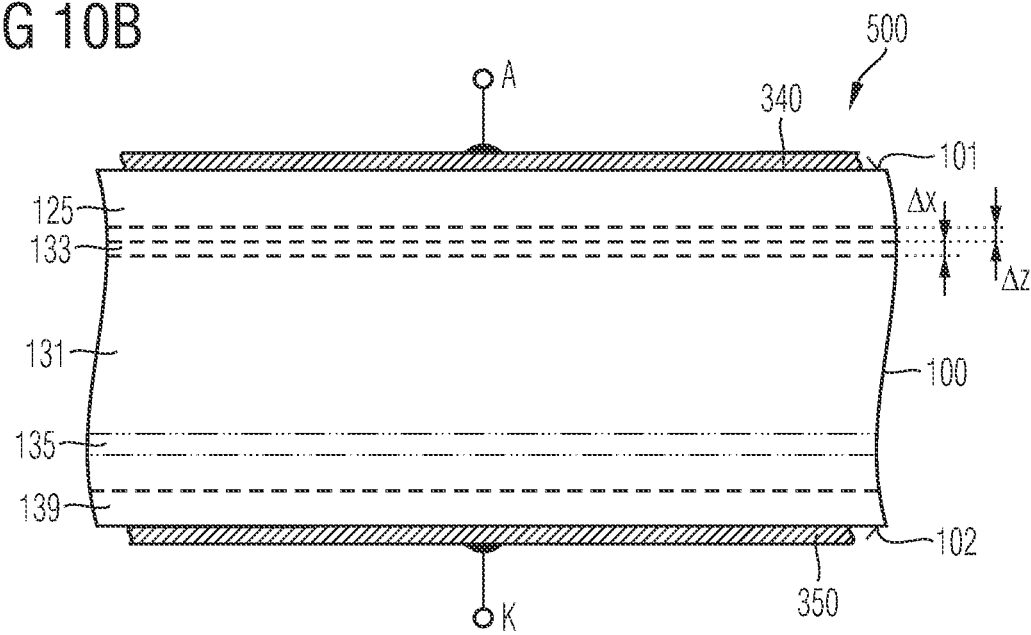
FIG. 10B is a schematic vertical cross section through a section of a SiC semiconductor component comprising a zone for reducing the emitter efficiency in accordance with one embodiment concerning semiconductor components comprising a pn diode structure, wherein the zone is formed at a distance from the injection region.

The semiconductor components 500 shown in FIGS. 10A and 10B in each case comprise a pn diode structure formed in a SiC semiconductor body 100. The semiconductor components 500 are for example pn diodes or such semiconductor components which, besides a pn diode, also comprise further semiconductor elements, e.g. transistors.

The SiC semiconductor bodies 100 in each case comprise a drift structure 130 having a drift zone 131 of a first conductivity type, wherein an average dopant concentration in the drift zone 131 is at least $5 \times 10^{14}$ cm$^{-3}$ and at most $5 \times 10^{16}$ cm$^{-3}$. Depending on the desired blocking capability of the components, a vertical extent of the drift zone 131 is at least 3 µm or at least 8 µm.

Between the drift structure 130 and a first surface 101, an injection region 125 of a second conductivity type is formed in the SiC semiconductor body 100 and adjoins a first surface 101 of the SiC semiconductor body 100. A contact structure 340 at the first surface 101 electrically contacts the injection region 125. The contact structure 340 forms an anode terminal A or is electrically connected to an anode terminal A.

Between the drift zone 131 and a second surface 102 of the SiC semiconductor body 100, said second surface being situated opposite the first surface 101, the drift structure 130 comprises a highly doped contact layer 139. A rear-side contact structure 350 forms an ohmic contact with the contact layer 139. The rear-side contact structure 350 can form a cathode terminal K of the semiconductor component 500 or be electrically connected to a cathode terminal K.

A zone 133 of the first conductivity type is formed between the injection region 125 and a second surface 102 of the SiC semiconductor body 100, said second surface being situated opposite the first surface 101, and is electrically isolated from the contact structure 340.

In the semiconductor component 500 in FIG. 10A, the zone 133 directly adjoins the injection region 125 of the second conductivity type and is structured in the horizontal direction.

By contrast, FIG. 10B shows a semiconductor component 500 comprising a continuous zone 133 spaced apart from the injection region 125, wherein a distance Δz between the injection region 125 and the zone 133 is at most 2 µm, e.g. at most of 1 µm.

For further details and embodiments of the SiC semiconductor body 100 and the zone 133, reference is made to the semiconductor components 500 described above. By way of example, the semiconductor components 500 according to FIGS. 10A and 10B can comprise at least one recombination zone 135 between the zone 133 and the second surface 102.

Figure 11A:
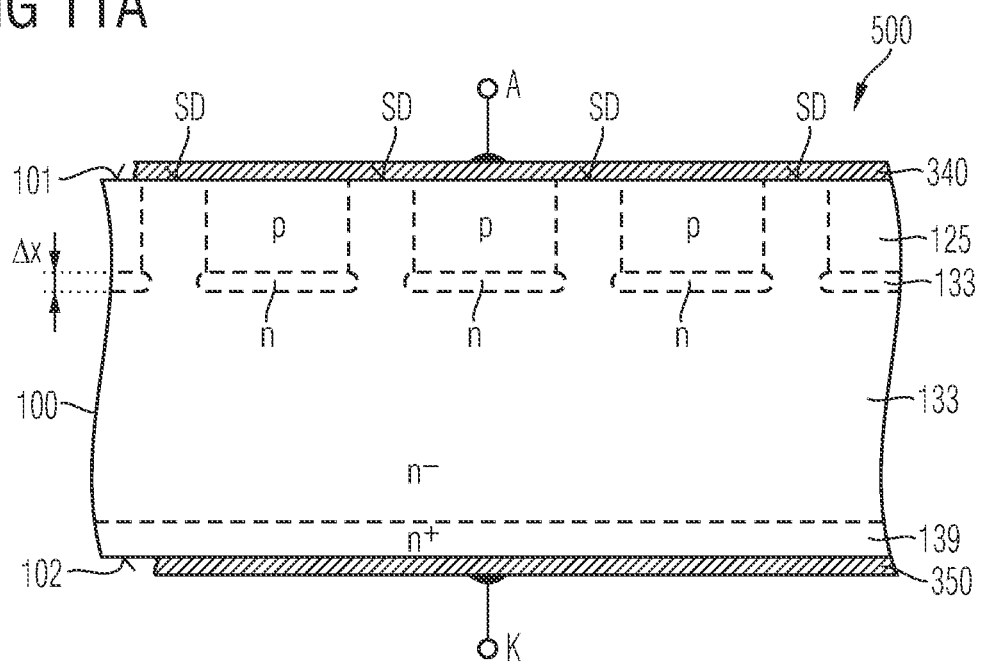
FIG. 11A is a schematic vertical cross section through a section of a SiC semiconductor component comprising zones for reducing the emitter efficiency in accordance with one embodiment concerning semiconductor components comprising an MPS diode structure, wherein the zones adjoin injection regions.
Figure 11B:
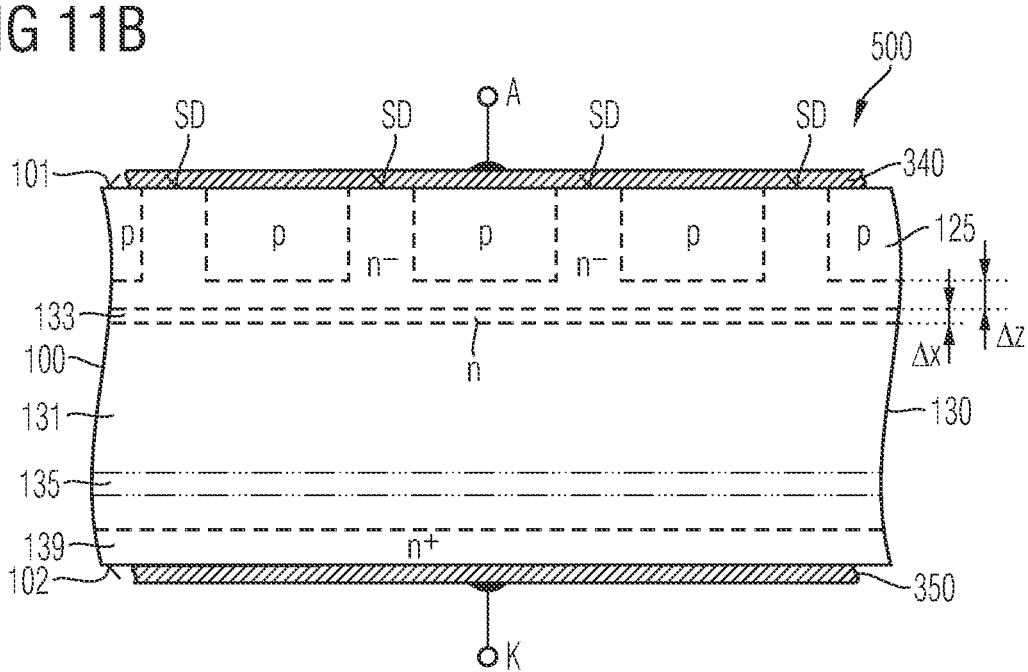
FIG. 11B is a schematic vertical cross section through a section of a SiC semiconductor component comprising a zone for reducing the emitter efficiency in accordance with one embodiment concerning semiconductor components comprising an MPS diode structure, wherein the zone is formed at a distance from injection regions.

The semiconductor components 500 in FIGS. 11A and 11B in each case comprise an MPS (merged pin Schottky) diode structure, formed predominantly in a SiC semiconductor body 100.

The SiC semiconductor bodies 100 in each case comprise a drift structure 130 having a drift zone 131 of a first conductivity type, wherein an average dopant concentration in the drift zone 131 is at least $10^{15}$ cm$^{-3}$. Depending on the desired blocking capability of the semiconductor component 500, a vertical extent of the drift zone 131 is at least 1 µm or at least 3 µm or at least 8 µm. It is possible for the vertical extent of the drift zone 131 to be at most 40 µm or at most 20 µm.

Between the drift structure 130 and a first surface 101, a multiplicity of injection regions 125 of a second conductivity type are in each case formed in the SiC semiconductor body 100 and adjoin a first surface 101 of the SiC semiconductor body 100. A contact structure 340 at the first surface 101 electrically contacts both the injection regions 125 and sections of the drift zone 131 which adjoin the first surface 101 between the injection regions 125, wherein the contact structure 340 forms a Schottky contact SC with the drift zone 131. The contact structure 340 forms an anode terminal A of the semiconductor component 500 or is electrically connected to an anode terminal A.

Between the drift zone 131 and a second surface 102 of the SiC semiconductor body 100, said second surface being situated opposite the first surface 101, the drift structure 130 comprises a highly doped contact layer 139. A rear-side contact structure 350 forms an ohmic contact with the contact layer 139. The rear-side contact structure 350 can form a cathode terminal K of the semiconductor component 500 or be electrically connected to a cathode terminal K.

At least one zone 133 of the first conductivity type is formed between the injection region 125 and a second surface 102 of the SiC semiconductor body 100, said second surface being situated opposite the first surface 101, and is electrically isolated from the contact structure 340.

The semiconductor component 500 in FIG. 11A comprises a multiplicity of zones 133, each directly adjoining one of the injection regions 125, wherein a lateral extent of the zones 133 can approximately correspond to the lateral extent of the injection regions 125.

By contrast, FIG. 11B shows a semiconductor component 500 comprising a continuous zone 133 spaced apart from the injection regions 125, wherein a vertical distance Δz between the injection regions 125 and the zones 133 is in each case at most 1 μm.

Figure 12A:
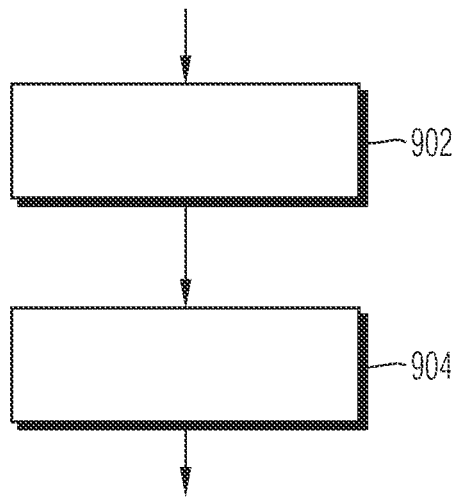
FIG. 12A is a schematic flow diagram for a method for producing a semiconductor component in accordance with one embodiment concerning semiconductor components comprising a field effect transistor structure.

FIG. 12A relates to a method for producing a semiconductor component 500 comprising a field effect transistor structure having transistor cells TC, as illustrated e.g. in FIGS. 2A and 2B.

A mask layer is applied on a semiconductor substrate comprising a precursor of a semiconductor body 100 as shown e.g. in FIGS. 2A and 2B and is structured by means of a photolithographic method, wherein an implantation mask having mask openings emerges from the mask layer. Here and hereinafter, a "semiconductor substrate" can comprise a wafer and/or an epitaxially grown silicon carbide semiconductor body.

Dopants that define the doped semiconductor regions are introduced through the mask openings by means of ion implantation (902). In addition, dopants that define the zones are introduced through the mask openings by means of ion implantation (904). The dopants that define the zones can be introduced before and/or after the dopants that define the semiconductor regions.

Figure 12B:
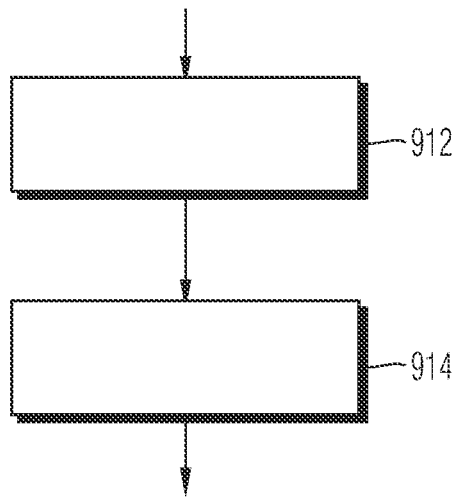
FIG. 12B is a schematic flow diagram for a method for producing a semiconductor component in accordance with one embodiment concerning semiconductor components comprising a fine pn diode structure.

FIG. 12B relates to a method for producing a semiconductor component 500 comprising an MPS diode structure as illustrated in FIG. 11A.

A mask layer is applied on a semiconductor substrate comprising a precursor of the semiconductor component 500 as illustrated in FIG. 11A and is structured by means of a photolithographic method, wherein an implantation mask having mask openings emerges from the mask layer.

Dopants that define the injection regions are introduced through the mask openings by means of ion implantation (912). Before or afterwards, dopants that define the zones are introduced by means of ion implantation (914).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
   a pn diode structure in a SiC semiconductor body having a drift zone of a first conductivity type;
   an injection region of a second conductivity type adjoining a first surface of the SiC semiconductor body;
   a contact structure at the first surface, the contact structure electrically contacting the injection region; and
   a zone of the first conductivity type formed between the injection region and a second surface of the SiC semiconductor body, the second surface being situated opposite the first surface,
   wherein the zone is electrically isolated from the contact structure at the first surface and is at a maximal distance of 1 μm from the injection region of the second conductivity type.

2. The semiconductor component of claim 1, wherein the zone is doped more highly than the drift zone, and wherein a maximum dopant concentration in the zone is greater than a minimum dopant concentration in the drift zone by at least a factor of 2.

3. The semiconductor component of claim 1, wherein a vertical extent of the zone lies in a range of from 50 nm to 1000 nm.

4. The semiconductor component of claim 1, wherein a dopant dose of the zone lies in a range of 5% to 20% of a breakdown charge of SiC.

5. The semiconductor component of claim 1, wherein the zone at the location of the maximum dopant concentration is partly compensated with dopants of the second conductivity type.

6. The semiconductor component of claim 1, wherein the zone is at least partly doped with a dopant having a deep energy level with a gap of at least 150 meV with respect to the closest band edge.

7. The semiconductor component of claim 6, wherein the dopant comprises at least one of phosphorus, chromium and iridium.

8. The semiconductor component of claim 1, further comprising:
   a recombination zone having recombination centres composed of lattice defects and/or heavy metal atoms,
   wherein the recombination zone is formed between the zone and a second surface situated opposite the first surface.

9. The semiconductor component of claim 8, further comprising:
   a further recombination zone having recombination centres composed of lattice defects and/or heavy metal atoms,
   wherein the further recombination zone is formed between the first surface and the recombination zone and is spaced apart from the recombination zone.

* * * * *